United States Patent
Takagi

(10) Patent No.: US 8,539,908 B2
(45) Date of Patent: Sep. 24, 2013

(54) FILM FORMING APPARATUS, FILM FORMING METHOD AND STORAGE MEDIUM

(75) Inventor: Toshio Takagi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 975 days.

(21) Appl. No.: 12/593,502

(22) PCT Filed: Mar. 13, 2008

(86) PCT No.: PCT/JP2008/054635
§ 371 (c)(1),
(2), (4) Date: Nov. 23, 2009

(87) PCT Pub. No.: WO2008/117675
PCT Pub. Date: Oct. 2, 2008

(65) Prior Publication Data
US 2010/0119727 A1 May 13, 2010

(30) Foreign Application Priority Data
Mar. 27, 2007 (JP) ................................. 2007-082533

(51) Int. Cl.
| C23C 16/455 | (2006.01) |
| --- | --- |
| C23C 16/52 | (2006.01) |
| C23F 1/00 | (2006.01) |
| H01L 21/306 | (2006.01) |
| G05B 15/00 | (2006.01) |
| G06F 17/00 | (2006.01) |
| C23C 16/06 | (2006.01) |
| C23C 16/22 | (2006.01) |

(52) U.S. Cl.
USPC ........... 118/696; 118/695; 118/697; 118/698; 118/715; 156/345.24; 156/345.33; 156/345.34; 700/90; 700/1

(58) Field of Classification Search
USPC ........................ 118/696; 156/345.33–345.34
See application file for complete search history.

(56) References Cited

U.S. PATENT DOCUMENTS

| 5,453,124 A * | 9/1995 | Moslehi et al. ................ 118/715 |
| 5,496,408 A * | 3/1996 | Motoda et al. ................ 118/715 |

(Continued)

FOREIGN PATENT DOCUMENTS

| JP | 5 152208 | 6/1993 |
| JP | 2004 6733 | 1/2004 |

(Continued)

OTHER PUBLICATIONS

Chinese Office Action issued on Dec. 22, 2010 in corresponding Chinese Application No. 200880010113.2 (with an English Translation).

Primary Examiner — Rudy Zervigon
(74) Attorney, Agent, or Firm — Oblon, Spivak, McClelland, Maier & Neustadt, L.L.P.

(57) ABSTRACT

A film forming apparatus includes a processing chamber, and a mounting table disposed in the processing chamber to mount a substrate thereon. The film forming apparatus further includes a gas shower head having gas supply holes and including a central region facing a central portion of the substrate and a peripheral region facing a peripheral portion of the substrate, a first processing gas supply unit for supplying a first processing gas to the central region, a second processing gas supply unit for supplying a second processing gas to the central region, an energy supply unit for supplying energy to react the first processing gas with the second processing gas on the substrate, and a purge gas supply unit for supplying a purge gas to the central region and the peripheral region when one of the first and the second processing gas is switched by the other.

9 Claims, 19 Drawing Sheets

(56) References Cited

U.S. PATENT DOCUMENTS

| | | | |
|---|---|---|---|
| 5,500,256 A * | 3/1996 | Watabe | 427/579 |
| 5,591,269 A * | 1/1997 | Arami et al. | 118/723 R |
| 5,669,976 A * | 9/1997 | Yuuki et al. | 118/725 |
| 5,888,907 A * | 3/1999 | Tomoyasu et al. | 438/714 |
| 5,958,140 A * | 9/1999 | Arami et al. | 118/725 |
| 6,287,980 B1 * | 9/2001 | Hanazaki et al. | 438/726 |
| 6,829,056 B1 * | 12/2004 | Barnes et al. | 356/625 |
| 7,431,859 B2 * | 10/2008 | Bera et al. | 216/67 |
| 7,481,902 B2 | 1/2009 | Shinriki et al. | |
| 7,491,430 B2 * | 2/2009 | Ishizaka et al. | 427/569 |
| 7,540,971 B2 * | 6/2009 | Bera et al. | 216/67 |
| 7,541,292 B2 * | 6/2009 | Bera et al. | 438/723 |
| 7,662,232 B2 * | 2/2010 | Kobayashi et al. | 118/715 |
| 7,666,479 B2 * | 2/2010 | Strang | 427/569 |
| 7,674,393 B2 * | 3/2010 | Tahara et al. | 216/58 |
| 7,674,394 B2 * | 3/2010 | Paterson et al. | 216/59 |
| 7,896,967 B2 * | 3/2011 | Hayasaka et al. | 118/715 |
| 8,083,889 B2 * | 12/2011 | Miya et al. | 156/345.25 |
| 8,187,415 B2 * | 5/2012 | Kim et al. | 156/345.44 |
| 8,193,097 B2 * | 6/2012 | Hirano | 438/710 |
| 8,231,799 B2 * | 7/2012 | Bera et al. | 216/67 |
| 8,235,001 B2 * | 8/2012 | Sano et al. | 118/696 |
| 8,236,380 B2 * | 8/2012 | Mizusawa | 427/248.1 |
| 8,397,668 B2 * | 3/2013 | Kobayashi et al. | 118/723 E |
| 8,402,845 B2 * | 3/2013 | Dedontney | 73/865.9 |
| 2002/0192369 A1 * | 12/2002 | Morimoto et al. | 427/248.1 |
| 2004/0050325 A1 * | 3/2004 | Samoilov et al. | 118/715 |
| 2004/0103844 A1 * | 6/2004 | Chou et al. | 118/715 |
| 2005/0211167 A1 | 9/2005 | Gunji et al. | |
| 2006/0016559 A1 * | 1/2006 | Kobayashi et al. | 156/345.34 |
| 2006/0042754 A1 * | 3/2006 | Yoshida et al. | 156/345.1 |
| 2006/0169671 A1 * | 8/2006 | Miya et al. | 216/67 |
| 2006/0191637 A1 * | 8/2006 | Zajac et al. | 156/345.34 |
| 2006/0211246 A1 * | 9/2006 | Ishizaka et al. | 438/685 |
| 2007/0175391 A1 * | 8/2007 | Mizusawa | 118/689 |
| 2007/0181255 A1 * | 8/2007 | Hayasaka et al. | 156/345.33 |
| 2007/0247075 A1 * | 10/2007 | Kim et al. | 315/111.21 |
| 2007/0249173 A1 * | 10/2007 | Kim et al. | 438/711 |
| 2007/0251642 A1 * | 11/2007 | Bera et al. | 156/345.26 |
| 2007/0251917 A1 * | 11/2007 | Bera et al. | 216/58 |
| 2007/0251918 A1 * | 11/2007 | Bera et al. | 216/58 |
| 2007/0254483 A1 * | 11/2007 | Bera et al. | 438/689 |
| 2007/0254486 A1 * | 11/2007 | Bera et al. | 438/706 |
| 2008/0178805 A1 * | 7/2008 | Paterson et al. | 118/723 I |
| 2008/0179011 A1 * | 7/2008 | Collins et al. | 156/345.44 |
| 2009/0042321 A1 * | 2/2009 | Sasaki et al. | 438/10 |
| 2009/0095423 A1 * | 4/2009 | Miya et al. | 156/345.33 |
| 2009/0117746 A1 * | 5/2009 | Masuda | 438/710 |
| 2009/0194235 A1 * | 8/2009 | Kobayashi et al. | 156/345.28 |
| 2009/0218317 A1 * | 9/2009 | Belen et al. | 216/67 |

FOREIGN PATENT DOCUMENTS

| | | |
|---|---|---|
| JP | 2004 193173 | 7/2004 |
| JP | 2006 287114 | 10/2006 |
| WO | 03 104524 | 12/2003 |

* cited by examiner (ADSORPTION)

(GAS REPLACEMENT)

(OXIDATION)

(GAS REPLACEMENT)

US 8,539,908 B2

FILM FORMING APPARATUS, FILM FORMING METHOD AND STORAGE MEDIUM

CROSS-REFERENCE TO RELATED APPLICATION(S)

This application claims the benefit of Japanese Patent Application No. 2007-0082533, filed on Mar. 27, 2007, which is hereby incorporated by reference herein in its entirety.

FIELD OF THE INVENTION

The present invention relates to a film forming technique in which a first processing gas and a second processing gas are alternately supplied plural times to form a film made of reaction products of the processing gases on a substrate.

BACKGROUND OF THE INVENTION

As a film forming method in a semiconductor fabrication process, there is known a method including adsorbing a first processing gas on the surface of a substrate, replacing the first processing gas with a second processing gas, reacting the two gases with each other to form one or more atomic or molecular layers, and repeating this cycle plural times to deposit these layers. This method is referred to as atomic layer deposition (ALD), molecular layer deposition (MLD) or the like. This method is an effective method capable of precisely controlling a film thickness depending on the number of cycles, realizing uniform film quality, and satisfying the demand for ultra thin films in semiconductor devices. This method is carried out by using a film forming apparatus 100 shown in FIG. 15 (see Japanese Patent Publication No. 2004-6733 (Paragraph [0056] and FIG. 8)).

In the film forming apparatus 100, a first processing gas containing, e.g., metal compounds is supplied from a processing gas supply port 102 provided on one side of a substrate 101 (the right side of FIG. 15) and, at the same time, is discharged from a gas exhaust port 104 provided to face the processing gas supply port 102 to thereby adsorb the processing gas on a substrate 101. Then, an ozone gas serving as a second processing gas is supplied from an ozone gas supply port 103 provided on the opposite side to the processing gas supply port 102 (the left side in FIG. 15) and, at the same time, is discharged from a gas exhaust port 105 to thereby oxidize the first processing gas adsorbed on the substrate 101 and form an oxide film. The supply and replacement of the first processing gas and the ozone gas are performed plural times to repeat plural (e.g., 100) cycles, each cycle including adsorption and oxidation of the first processing gas, thereby obtaining an oxide film with a desired thickness.

The cycle, wherein the first processing gas and the ozone gas are alternately supplied, is performed every several seconds. Accordingly, it is necessary to switch from the gas exhaust port 104 to the gas exhaust port 105 and vice versa at a high speed. Thus, the gas exhaust ports 104 and 105 are respectively provided with high-speed rotation valves 106. As the high-speed rotation valves 106 are rotated in accordance with the cycle, the gas exhaust ports 104 and 105 are opened or closed to switch a gas exhaust place at a high speed.

The film formation is carried out in a side flow manner to flow a gas from one side of the substrate 101 to the other side thereof (in a horizontal direction in the drawing). Thus, the film formation is performed in a mild atmosphere at a low temperature of about 200 to 240° C. in order to prevent segregation in film thickness or film quality in a horizontal direction.

Meanwhile, e.g., tetrakis(ethylmethylamino)zirconium (TEMAZ) gas is used as a first processing gas to form a film made of a high-k dielectric material, e.g., zirconium oxide ($ZrO_2$). Since the above-mentioned gas is rarely decomposed at a low temperature, when a film is formed at a low temperature, impurities infiltrate into the film to cause deterioration in film quality. Accordingly, this material is used for film formation at a high temperature of about 280° C. However, in the high-temperature film formation, film thickness formed in one cycle increases due to rapid reaction. Also, gas needs to move for a long distance on the surface of the substrate 101 in a side flow manner. Thus, it may cause deterioration in in-plane uniformity of film thickness, that is, an increase in film thickness on the gas supply side and a decrease in film thickness on the gas exhaust side.

Further, gas of a high-k dielectric material is expensive. If a flow rate is decreased to reduce a gas consumption amount, the film thickness increases on the supply side of the first processing gas as shown in FIG. 16A. Further, for example, when an ozone gas is supplied for a short period of time for the purpose of improving throughput, an oxidation power of ozone gas becomes weakened due to consumption of the ozone gas as it goes farther from an ozone gas supply source. Accordingly, an adsorbed film formed on the substrate 101 may be incompletely oxidized as shown in FIG. 16B, thereby causing deterioration in in-plane uniformity of leakage current.

Further, as shown in FIG. 16C, the processing gas flowing in the vicinity of the substrate 101 takes part in the reaction, whereas the processing gas flowing in a region apart from the substrate 101 is discharged, thus causing low film formation efficiency (film formation ratio) and waste of expensive processing gas. Also, a long period of time is necessary to obtain a desired film thickness. Further, the high-speed rotation valve 106 is expensive and the manufacturing cost of the film forming apparatus 100 is high. Therefore, it requires improvement.

Consequently, there was suggested a method for supplying a gas from above the substrate 101 by using a general gas shower head included in a CVD apparatus (see Japanese Patent Publication No. 2006-299294 (Paragraphs [0021] to [0026] and FIG. 1)). In accordance with this method, the gas moves from the center of the substrate to the periphery thereof and its movement distance is short compared to the side flow manner. Accordingly, it is possible to obtain superior in-plane uniformity in film thickness and film quality. However, this gas shower head has a large size, and it is necessary to replace the atmosphere inside the gas shower head in every switching of the processing gas in order to alternately supply the processing gases plural times, as mentioned above. As a result, the amount of processing gas wasted increases. Further, in the gas shower head, the volume of the replaced gas (the volume of the gas shower head) is large and it requires a long period of time in gas replacement, thus causing deterioration in throughput.

Further, there is no established dry cleaning method for removing deposits in the chamber produced by the TEMAZ gas serving as a source for the high-k dielectric material and a manual wet cleaning method is employed instead. Accordingly, it is required to reduce a contact area of the processing gas and to shorten cleaning time.

However, in the method using a gas shower head, when one of the first and the second processing gas is switched by the other gas, the atmosphere inside the gas shower head should be changed by using a purge gas in order to prevent particles from being generated in the gas shower head. This gas replacement should be quickly performed by supplying a large amount of purge gas to prevent deterioration in throughput.

FIG. 17 shows an example of a film forming apparatus 200 which includes a substantially mushroom-shaped processing chamber 201 and a stage 202 in which a heater 203 is embedded. A gas shower head 205 is provided at a top wall of the processing chamber 201 to supply a processing gas to the substrate 210 placed on the stage 202. The processing gas is supplied from the gas shower head 205 to the substrate 210 and is discharged through a gas exhaust port 208 provided at a lower sidewall of the processing chamber 201.

In the film forming apparatus 200, the processing gas is discharged from one end portion of a lower part of the processing chamber 201, thereby causing drift in flow of the processing gas in the processing chamber 201. This leads to non-uniform flow of the processing gas on the substrate 210 and variations in film thickness. Further, as a gas flow rate increases, variations in film thickness further increases. Accordingly, there is another problem that it is impossible to supply a large amount of purge gas in the film forming apparatus 200. Moreover, the stage 202 is connected to an elevator (not shown) provided thereunder such that the stage 202 is elevated by an elevating mechanism (not shown) provided outside the processing chamber 201. Since the processing chamber 201 is kept hermetically sealed, a bellows (not shown) should be provided between the elevator and the bottom surface of the processing chamber 201 such that the bellows is extended and contracted while the stage 202 is elevated. In this case, the processing gases or reaction products may be deposited on the bellows and the bellows may be damaged upon contraction to cause leakage of the processing chamber 201.

Further, a film forming apparatus 220 shown in FIG. 18 is provided with a ring-shaped baffle plate 209 separated from an inner space of the processing chamber 201 to form an annular area, which extends from side of the stage 202 to bottom of the processing chamber 201 provided with a gas exhaust port 208, in order to form a uniform flow of processing gas on the substrate 210. The baffle plate 209 includes a plurality of holes 211 having a small diameter formed on the upper surface thereof to narrow a passage of the processing gas flowing in the baffle plate 209. As the holes 211 are formed to have a small area, an inner pressure of the processing chamber 201 uniformly increases. Thus, the processing gas flows uniformly toward the holes 211 and is isotropically discharged from the surface of the substrate 210.

However, in the film forming apparatus 220, the flow rate of purge gas cannot be greatly increased due to the small diameter of the holes 211, and it takes a long time in gas replacement when one of the film forming gas and the oxidizing gas is switched by the other, causing deterioration in throughput.

SUMMARY OF THE INVENTION

In accordance with a first aspect of the present invention, there is provided a film forming apparatus comprising: a processing chamber; a mounting table disposed in the processing chamber to mount a substrate thereon; a gas shower head facing the substrate mounted on the mounting table, having gas supply holes, and including a central region facing a central portion of the substrate and a peripheral region facing a peripheral portion of the substrate; a first processing gas supply unit including a first processing gas supply line to supply a first processing gas to the central region of the gas shower head; a second processing gas supply unit including a second processing gas supply line to supply a second processing gas to the central region of the gas shower head; an energy supply unit for supplying energy to react the first processing gas with the second processing gas on the substrate; and a purge gas supply unit for supplying a purge gas to the central region and the peripheral region of the gas shower head when one of the first and the second processing gas is switched by the other.

In the film forming apparatus, preferably, an area of the central region of the gas shower head is 50% or less of an area of the peripheral region of the gas shower head.

In the film forming apparatus, preferably, the first processing gas supply line is independent of the second processing gas supply line.

In the film forming apparatus, preferably, the first processing gas supply line and the second processing gas supply line share, at least partially, a common passage.

In the film forming apparatus, preferably, the energy supply unit includes a heater to heat the substrate mounted on the mounting table.

In the film forming apparatus, preferably, the first processing gas includes a film forming gas to form a film made of a compound containing at least one selected from a group consisting of Zr, Hf, Si, Sr, Ti, Y and La, and the second processing gas includes an oxidizing gas for oxidizing the compound to obtain a high-k dielectric material.

In accordance with a second aspect of the present invention, there is provided a method for forming a film by using a film forming apparatus, which includes a processing chamber; a mounting table disposed in the processing chamber; a gas shower head facing the substrate mounted on the mounting table, having gas supply holes, and including a central region facing a central portion of the substrate and a peripheral region facing a peripheral portion of the substrate; and an energy supply unit for supplying energy, the method comprising the steps of: (a) mounting a substrate on a mounting table in a processing chamber; (b) supplying a first processing gas to the central region of the gas shower head to supply the first processing gas to the substrate from the central region; (c) replacing the first processing gas with a purge gas in the processing chamber by supplying the purge gas to the central region and the peripheral region of the gas shower head; (d) supplying a second processing gas to the central region in the gas shower head to supply the second processing gas to the substrate from the central region; (e) supplying energy by using the energy supply unit to react the first processing gas with the second processing gas on the substrate; (f) replacing the second processing gas with a purge gas in the processing chamber by supplying the purge gas to the central region and the peripheral region of the gas shower head; and repeating the steps (b), (c), (d) and (f) plural times.

In the film forming method, preferably, an area of the central region of the gas shower head is 50% or less of an area of the peripheral region of the gas shower head.

In the film forming method, preferably, the first processing gas supplied to the central region of the gas shower head and the second processing gas supplied to the central region of the gas shower head pass through different channels.

In the film forming method, preferably, the first processing gas supplied to the central region of the gas shower head and the second processing gas supplied to the central region of the gas shower head pass through, at least partially, a common channel.

In the film forming method, preferably, the step (e) of supplying energy includes heating the substrate mounted on the mounting table by using the energy supply unit.

In accordance with a third aspect of the present invention, there is provided a storage medium storing a computer program for performing a film forming method by using a film forming apparatus, which includes a processing chamber; a mounting table disposed in the processing chamber; a gas shower head facing the substrate mounted on the mounting table, having gas supply holes, and including a central region facing a central portion of the substrate and a peripheral region facing a peripheral portion of the substrate; and an energy supply unit for supplying energy, the method comprising the steps of: (a) mounting a substrate on a mounting table in a processing chamber; (b) supplying a first processing gas to the central region of the gas shower head to supply the first processing gas to the substrate from the central region; (c) replacing the first processing gas with a purge gas in the processing chamber by supplying the purge gas to the central region and the peripheral region of the gas shower head; (d) supplying a second processing gas to the central region in the gas shower head to supply the second processing gas to the substrate from the central region; (e) supplying energy by using the energy supply unit to react the first processing gas with the second processing gas on the substrate; (f) replacing the second processing gas with a purge gas in the processing chamber by supplying the purge gas to the central region and the peripheral region of the gas shower head; and repeating the steps (b), (c), (d) and (f) sequentially plural times.

In accordance with the aspects of the present invention, a first processing gas and a second processing gas are alternately supplied from a gas shower head facing a substrate, to form a film made of reaction products of the processing gases on the substrate. Accordingly, it is possible to improve in-plane uniformity in film thickness and film quality, compared to a side flow manner. Further, the gas shower head is divided into a central region and a peripheral region and the first processing gas and the second processing gas are alternately supplied from the central region. Accordingly, it is possible to reduce the volume of the gas shower head filled with the processing gas and shortening time required for replacement of the processing gas in the gas shower head. Further, during replacement of process atmosphere, a purge gas is additionally discharged from the peripheral region of the gas shower head. Accordingly, it is possible to shorten replacement time of the processing gas and improve throughput. Further, the volume of processing gas filled in the gas shower head is small. Accordingly, it is possible to reduce the amount of discharged processing gas during every replacement of the processing gas.

BRIEF DESCRIPTION OF THE DRAWINGS

FIGS. 14A and 143 are characteristic graphs showing the results of Examples in accordance with the embodiments of the present invention.

DETAILED DESCRIPTION OF THE EMBODIMENTS

Figure 1:
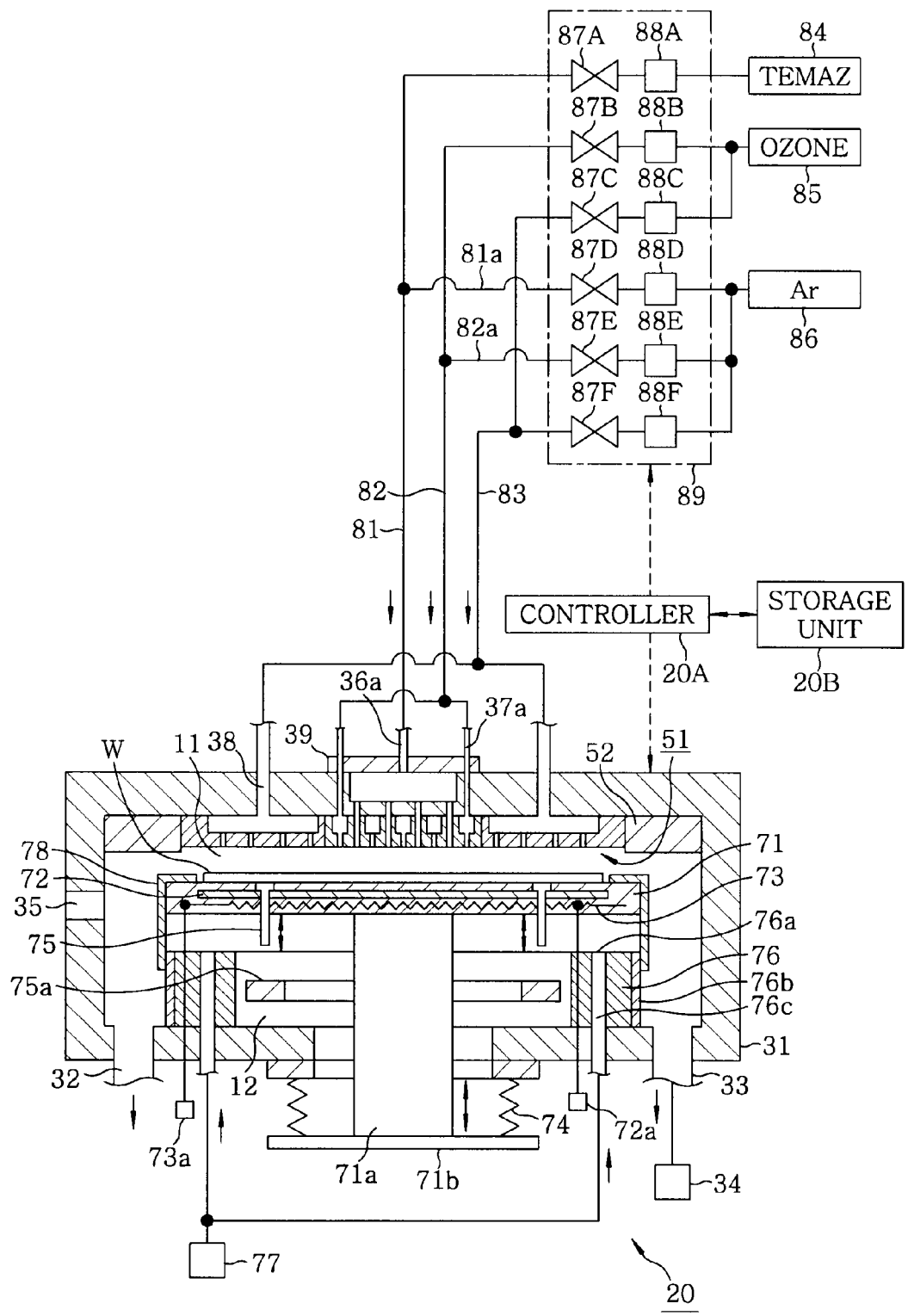
FIG. 1 is a longitudinal cross sectional view illustrating one example of a film forming apparatus in accordance with a first embodiment of the present invention.
Figure 2:
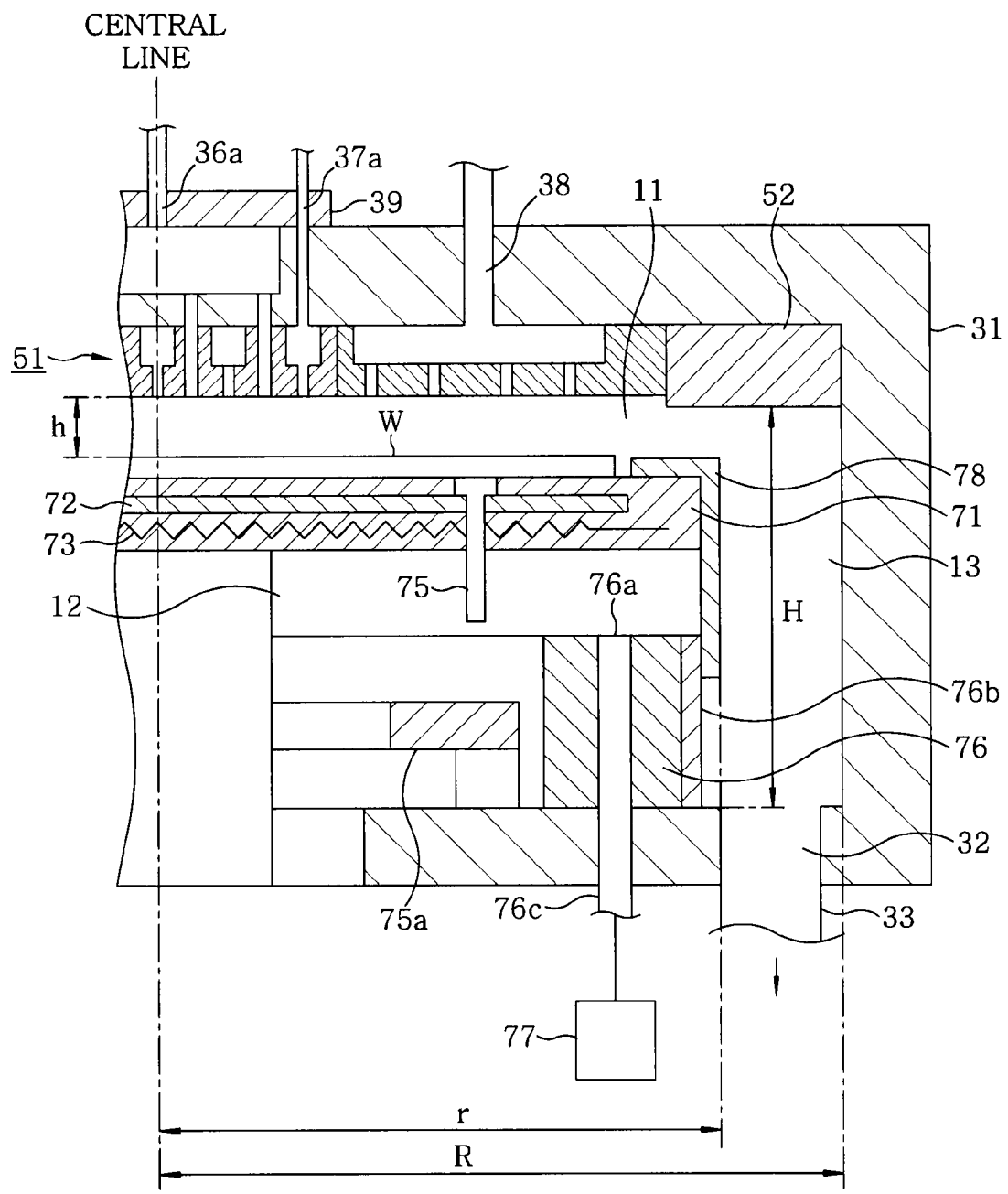
FIG. 2 is an enlarged cross sectional view illustrating a processing chamber of the film forming apparatus.

Hereinafter, a film forming apparatus 20 in accordance with a first embodiment of the present invention will be described with reference to FIGS. 1 to 5. The film forming apparatus 20 includes a processing chamber 31, a gas shower head 51 serving as a gas supply unit, and a flat cylindrical stage 71 serving as a mounting table on which a substrate, e.g., a semiconductor wafer (hereinafter, referred to as a "wafer W") is mounted.

The gas shower head 51 is provided at a top wall of the processing chamber 31 such that it faces the wafer W mounted on the stage 71. A processing region (processing space) 11 is formed between the gas shower head 51 and the wafer W. A ring body 52 is provided at the outside of the gas shower head 51 to control gas flow such that a lower end surface of the ring body 52 is lower than a lower end surface of the gas shower head 51 (the ring body 52 is vertically closer to the wafer W). The ring body 52 controls a gas stream, which flows from a processing atmosphere of the processing region 11 toward the outside, on the flat bottom surface thereof such that the processing gas uniformly flows in the outer peripheral portion of the wafer W. The lower end surface of the ring body 52 may be flush with the lower end surface of the gas shower head 51.

The stage 71 includes an electrostatic chuck 72 to electrostatically attract the wafer W, and the electrostatic chuck 72 is connected to a power supply 72a. Further, the stage 71 includes a heater (heating device) 73 connected to a power supply 73a, and the heater 73 heats the wafer W to a temperature of e.g., 600° C. The heater 73 corresponds to an energy supply unit for supplying energy to react a first processing gas (film forming gas) with a second processing gas (ozone gas) on the wafer W.

The stage 71 is supported from the bottom by a cylindrical support member 71a serving as an elevating part. The stage 71 is configured to move up and down by an elevator (not shown) within a predetermined distance, e.g., 60 mm between a process position at which the wafer W is processed and a transfer position at which the wafer W is loaded/unloaded into/from the processing chamber 31 through a transfer port 35 formed on the wall of the processing chamber 31. At the process position, a distance h between the gas shower head 51 and the wafer W is, e.g., 8 mm. Further, the processing gas may remain near the transfer port 35, and it hinders a film formation process from being uniformly performed. Accordingly, in order to perform a film formation process while suppressing influence of gas flow near the transfer port 35, the position of the stage 71 is varied in a range from the process position to the transfer position. An elevating plate 71b is connected to the bottom surface of the support member 71a. The elevating plate 71b is hermetically coupled to the bottom surface of the processing chamber 31 via a bellows 74 serving as a seal member. The bellows 74 is configured to be extensible and contractible to keep the inside of the processing chamber 31 hermetically sealed, although the stage 71 moves up and down.

Further, the stage 71 is provided with pins 75 in, e.g., three openings to elevate the wafer W. Each of the pins 75 includes a needle-shaped lower part and an upper part that having a diameter larger than that of the lower part. The pins 75 are elevated by a ring-shaped elevating member 75a provided at a lower portion of the processing chamber 31. When the elevating member 75a moves downward away from the pins 75, larger diameter portions formed at the tops of the pins 75 block openings of the stage 71, to separate a lower region (lower space) 12 provided below the stage 71 from the processing region 11. Further, by this configuration, the process can be performed while adjusting the distance between the wafer W and the gas shower head 51 (i.e., a height of the processing region 11).

A supporter 76 serving as a first annular wall is provided at the bottom of the processing chamber 31 under the stage 71 such that the supporter 76 has the same axis as the stage 71 and has the same diameter as the stage 71. A supporter cover 76b made of, e.g., aluminum is provided around the supporter 76 to prevent reaction products from being deposited on the supporter 76. A stage cover 78 made of quartz and serving as a second annular wall is provided on a side surface of the stage 71 and an exposed surface of the stage 71 (i.e., an outer peripheral side of the wafer W) to prevent reaction products from being deposited on the surface of the stage 71. The sidewall of the stage cover 78 extends to a level lower than the stage 71 and is in contact with to the outer peripheral surface of the supporter cover 76b. The stage cover 78 vertically overlaps with the supporter 76 to prevent the processing gas from turning to the lower region 12. Although the stage 71 is moved up to the process position, the stage cover 78 vertically overlaps with the supporter 76 to separate the lower region 12 from the atmosphere of the processing region 11 in which the wafer W is arranged.

Further, for example, four gas supply holes 76a are formed on the top surface of the supporter 76 at equal intervals in a circumferential direction to communicate with the lower region 12. The gas supply holes 76a are connected to a gas source 77 containing, e.g., a nitrogen gas through a gas supply line 76c. The gas contained in the gas source 77 is supplied to the lower region 12 such that the pressure of the lower region 12 is slightly higher than the pressure of the processing region 11, thereby further preventing the processing gas from turning to the lower region 12. For example, a pressure gauge (not shown) is provided in the lower region 12, so that the pressure of the lower region 12 is set to be slightly higher than the pressure of the processing region 11.

A ring-shaped space having a height H mm, an outer radius R mm and an inner radius r mm, which is surrounded by the side surface of the stage cover 78 and the inner wall of the processing chamber 31, forms a gas exhaust space 13. In this embodiment, for example, the respective dimensions H, R and r are 152 mm, 250 mm and 206 mm. Further, a volume V1 of the processing region 11 and a volume V2 of the gas exhaust space 13 are 1.07 liters and 9.61 liters, respectively. The ratio of the volumes (V2÷V1) is 9.0. Further, the outer radius R and the inner radius r represent outer and inner radii of the ring-shaped space, respectively, and the volume V1 of the processing region 11 is $\pi r^2 h$ in FIG. 2.

Four gas exhaust ports 32 having a radius of, e.g., 25 mm are formed on the bottom surface of the processing chamber 31 at equal intervals in a circumferential direction to surround the outside of the supporter 76. The gas exhaust ports 32 are connected to a vacuum exhaust unit 34 such as a vacuum pump through gas exhaust lines 33. Further, heaters (not shown) may be provided in the gas exhaust lines 33 to prevent products generated in the processing region 11 from being deposited on the inside of the gas exhaust lines and a detailed explanation thereof is omitted. The number of the gas exhaust ports 32 may be four or more, e.g., eight. A ratio of an area of the bottom surface of the gas exhaust space 13 (the bottom surface of the processing chamber 31) to a total area of all the gas exhaust ports 32 (i.e., the bottom area of gas exhaust space 13÷the total area of the gas exhaust ports 32) is 8.0.

Further, a deposition shield (not shown) made of, e.g., aluminum may be adhered to portions such as the inner wall of the processing chamber 31 and the gas exhaust lines 33, which are in contact with the processing gas, and a detailed explanation thereof is omitted.

Figure 3:
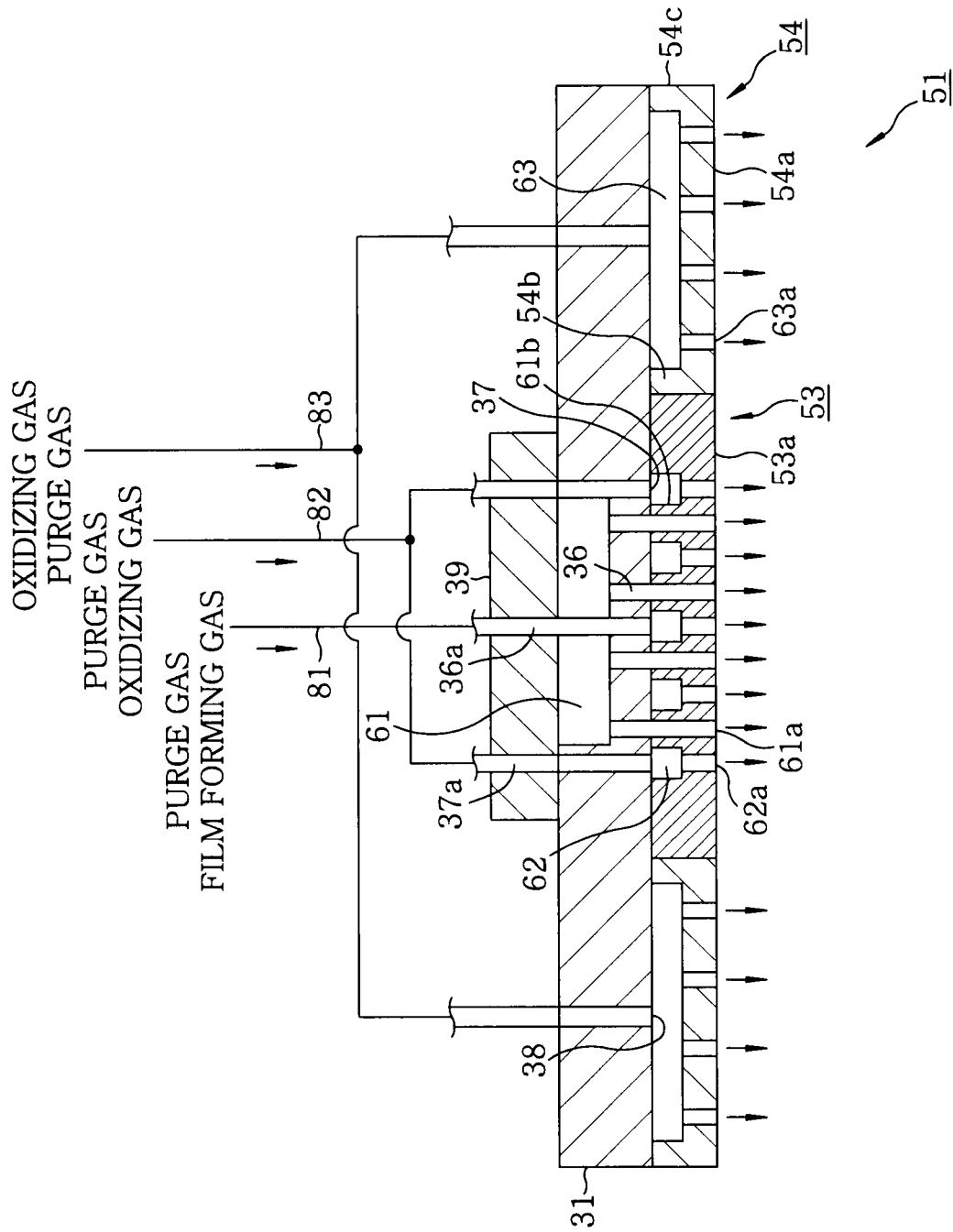
FIG. 3 is a longitudinal cross sectional view illustrating one example of a gas shower head provided in the film forming apparatus.
Figure 4:
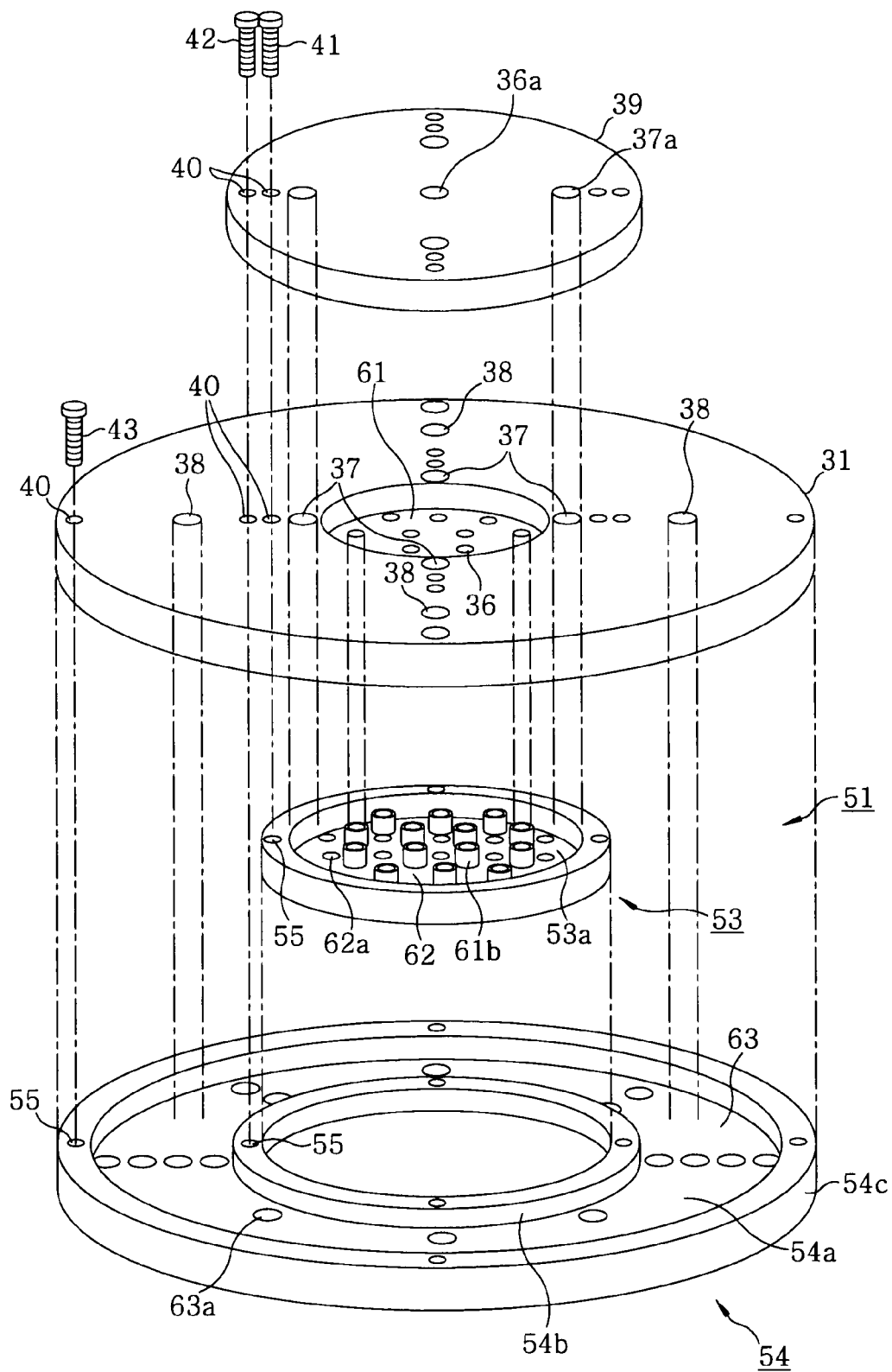
FIG. 4 is an exploded perspective view of the gas shower head.

Then, the gas shower head 51 will be described in detail. The gas shower head 51 includes a central region 53 facing a central portion of the wafer W, and a peripheral region 54 facing a peripheral portion of the wafer W, as shown in FIGS. 3 and 4. The radii of the bottom surfaces of the central region 53 and the peripheral region 54 are 85 mm and 160 mm, respectively. The gas shower head 51 is configured to supply a film forming gas, an ozone gas and a purge gas from the central region 53 and to supply an ozone gas and a purge gas from the peripheral region 54. Further, the film forming gas serving as a first processing gas and the ozone gas serving as a second processing gas are not mixed with each other in the central region 53 and are independently supplied to the processing region 11. That is, a first gas supply line (first processing gas supply line) 81 for supplying a film forming gas to the central region 53 of the gas shower head 51 is independent of a second gas supply line (second processing gas supply line) 82 for supplying an ozone gas to the central region 53 of the gas shower head 51. Hereinafter, the gas shower head 51 will be described in more detail.

Figure 5:
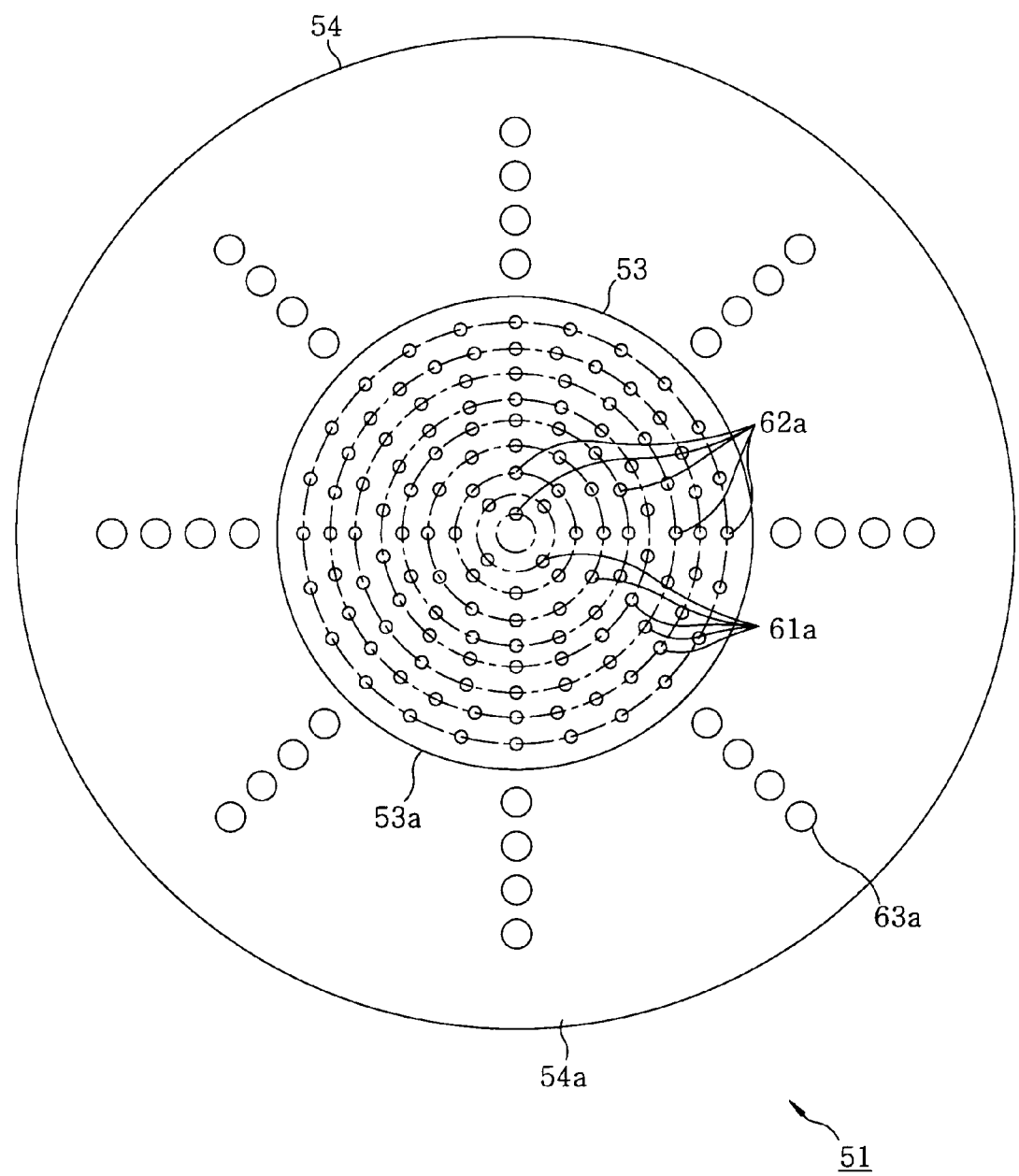
FIG. 5 is a plan view seen from the bottom of the gas shower head.
Figure 6:
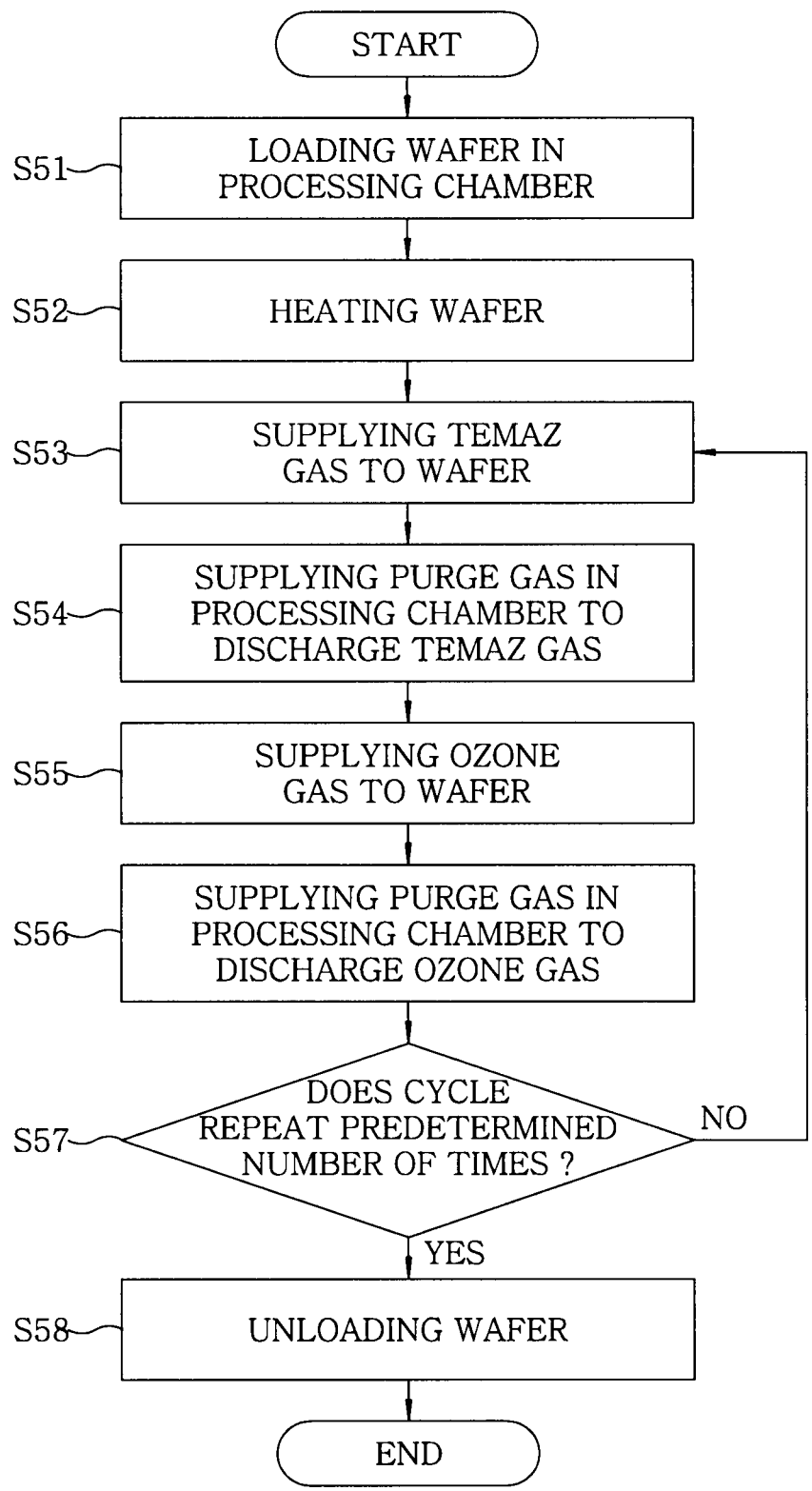
FIG. 6 is a flow chart illustrating a film forming method in accordance with the embodiment of the present invention.

The central region 53 is configured as a flat cylindrical body 53a having openings on its top surface. An inner space of the cylindrical body 53a forms a second diffusion space 62, in which an ozone gas diffuses, as will be described later. The cylindrical body 53a is provided, on its bottom surface, with a plurality of second discharge holes 62a, through which an ozone gas is supplied from the second diffusion space 62 to the processing region 11. Further, the cylindrical body 53a is provided with a plurality of ring-shaped columns 61b such that the height of the top surfaces of the columns is equal to the height of the peripheral wall of the cylindrical body 53a. Openings of the columns 61b form a part of a passage of the film forming gas. The columns 61b communicate with the processing region 11 through first discharge holes (gas supply holes) 61a formed on the bottom surfaces thereof. The first discharge holes 61a and the second discharge holes (gas supply holes) 62a are arranged on a plurality of concentric circles having different diameters, and are alternately arranged from the inner periphery toward the outer periphery, as shown in FIG. 5. Further, FIG. 5 illustrates the structure of the gas shower head 51 seen from the bottom thereof (the side of the wafer W).

The peripheral region 54 is provided with upright walls 54b and 54c on the inner periphery and the outer periphery, respectively. The peripheral region 54 includes a ring body 54a which is concentric with the cylindrical body 53a and has the same height as the cylindrical body 53a. The inner space of the ring body 54a forms a third diffusion space 63 in which a purge gas or ozone gas diffuses. The ring body 54a is provided, on its bottom surface, with third discharge holes (gas supply holes) 63a, wherein eight third discharge holes 63a are arranged at equal intervals in a circumferential direction and four third discharge holes 63a are arranged at equal intervals in a diameter direction.

The central region 53 and the peripheral region 54 are hermetically joined to the top wall of the processing chamber 31 to form the gas shower head 51. Further, the peripheral wall of the cylindrical body 53a and the upright walls 54b and 54c of the ring body 54a may be provided with grooves and seal members inserted into the grooves on the top surfaces thereof, or the top surfaces thereof may be polished to maintain airtightness between the central and peripheral regions 53 and 54 and the top wall of the processing chamber 31. A detailed explanation thereof is omitted.

A bottom area ($\alpha$) of the central region 53 is preferably 50% or less, more preferably, 30 to 40%, of a bottom area ($\beta$) of the peripheral region 54. Here, $\alpha$ is a bottom area of the cylindrical body 53a and $\beta$ is a bottom area of the ring body 54a. Further, in this embodiment, the first discharge holes 61a and the second discharge holes 62a are arranged in a concentric pattern and it is a layout for convenience. For example, the first and second discharge holes 61a and 62a may be arranged in a lattice pattern.

For example, four third gas supply holes 38 are arranged on the top wall of the processing chamber 31 at equal intervals in a circumferential direction to communicate with the third diffusion space 63 of the peripheral region 54. Further, for example, four second gas supply holes 37 are arranged on the top wall of the processing chamber 31 at equal intervals in a circumferential direction to communicate with the second diffusion space 62 of the central region 53. A circular groove is formed as a first diffusion space 61 at a central portion of an upper surface (outside) of the top wall of the processing chamber 31, and a plurality of first gas supply holes 36 are formed on the bottom surface thereof. The first gas supply holes 36 are arranged at the same positions as those of the columns 61b of the central region 53 such that the first diffusion space 61 hermetically communicates with the processing region 11 through the openings in the columns 61b.

A cover 39 is provided on the top surface of the processing chamber 31 to hermetically seal the first diffusion space 61. The cover 39 includes a first gas supply hole 36a for supplying a film forming gas to the first diffusion space 61 and a plurality of second gas supply holes 37a communicating with the first gas supply holes 36a. Further, grooves and seal members inserted into the grooves are provided at corresponding positions between the second gas supply holes 37 provided on the top surface of the processing chamber 31 and the cover 39, and a detailed explanation thereof is omitted. Further, the top wall of the processing chamber 31 and the cover 39 are provided with holes 40 at positions corresponding to the upper surface of the peripheral wall of the cylindrical body 53a and the upright wall 54b of the ring body 54a. For example, four holes 40 are spaced apart from one another by a predetermined distance in each circumferential direction. The cover 39, the processing chamber 31, the cylindrical body 53a and the ring body 54a can be in close contact with one another by inserting bolts 41 and 42 from the top surface of the cover 39 through the holes 40 into screw holes 55 formed on the upper surface of the peripheral wall of the cylindrical body 53a and the upright wall 54b of the ring body 54a. Similarly, holes 40 are formed on the top wall of the processing chamber 31 at positions corresponding to the upright wall 54c of the ring body 54a and, for example, four holes 40 are spaced apart from one another by a predetermined distance in a circumferential direction. Bolts 43 are inserted into the screw holes 55 of the upright wall 54c.

The first gas supply hole 36a and the second gas supply holes 37a formed in the cover 39, as shown in FIG. 1, are connected to the first gas supply line 81 and the second gas supply line 82, respectively. The third gas supply holes 38 formed on the ceiling of the processing chamber 31 are connected to a third gas supply line 83 serving as a purge gas supply line. These gas supply lines 81, 82 and 83 are connected through valves 87A, 87B and 87F and mass flow controllers 88A, 88B and 88F to a film forming gas source 84 storing, e.g., tetrakis(ethylmethylamino) zirconium (TEMAZ) gas serving as a first processing gas, an oxidizing gas source 85 storing a second processing gas (e.g., ozone) and a purge gas source 86 storing a purge gas (e.g., argon) provided at upstream sides thereof, respectively. Further, the gas supply lines 81 and 82 branch into a purge gas supply line 81a and a purge gas supply line 82a connected to the purge gas source 86 through valves 87D and 87E and mass flow controllers 88D and 88E, respectively. The third gas supply line 83 is branched and connected to an oxidizing gas source 85 through a valve 87C and a mass flow controller 88C. These valves 87A to 87F and mass flow controllers 88A to 88F form a gas flow control unit 89.

Further, in this embodiment, the film forming gas source 84, the valve 87A, the mass flow controller 88A and the gas supply line 81 form a first processing gas supply unit. Further, the oxidizing gas source 85, the valve 87B, the mass flow controller 88B and the gas supply line 82 form a second processing gas supply unit. Furthermore, the purge gas source 86, the valves 87D, 87E and 87F, the mass flow controllers 88D, 88E and 88F, and the gas supply lines 81, 82 and 83 form a purge gas supply unit.

The film forming apparatus 20 is provided with a controller 20A including, e.g., a computer. The controller 20A includes a data processor having a program, a memory and CPU. The program includes commands to send control signals from the controller 20A to respective components of the film forming apparatus 20 such that steps to be described later are carried out to perform the process or transfer of the wafer W. Further, for example, the memory includes an area, in which process parameters such as process pressure, process temperature, process time, gas flow and power level are recorded. When the CPU performs program commands, the process parameters are read and control signals depending on the parameters are transferred to respective components of the film forming apparatus 20. The program (including programs associated with input operations and display of process parameters) is stored in a storage unit 20B as a computer storage medium such as flexible disk, compact disk, magneto-optical disk (MO) or hard disk and is installed in the controller 20A.

Further, the controller 20A controls the first processing gas supply unit, the second processing gas supply unit and the purge gas supply unit, to repeat plural times the sequential steps of supplying a TEMAZ gas (first processing gas) from the central region 53 to the wafer W; supplying an Ar gas (purge gas) from the central region 53 and the peripheral region 54 to the wafer W; supplying an ozone gas (second processing gas) from the central region 53 to the wafer W; and supplying an Ar gas (purge gas) from the central region 53 and the peripheral region 54 to the wafer W.

Figure 7A:
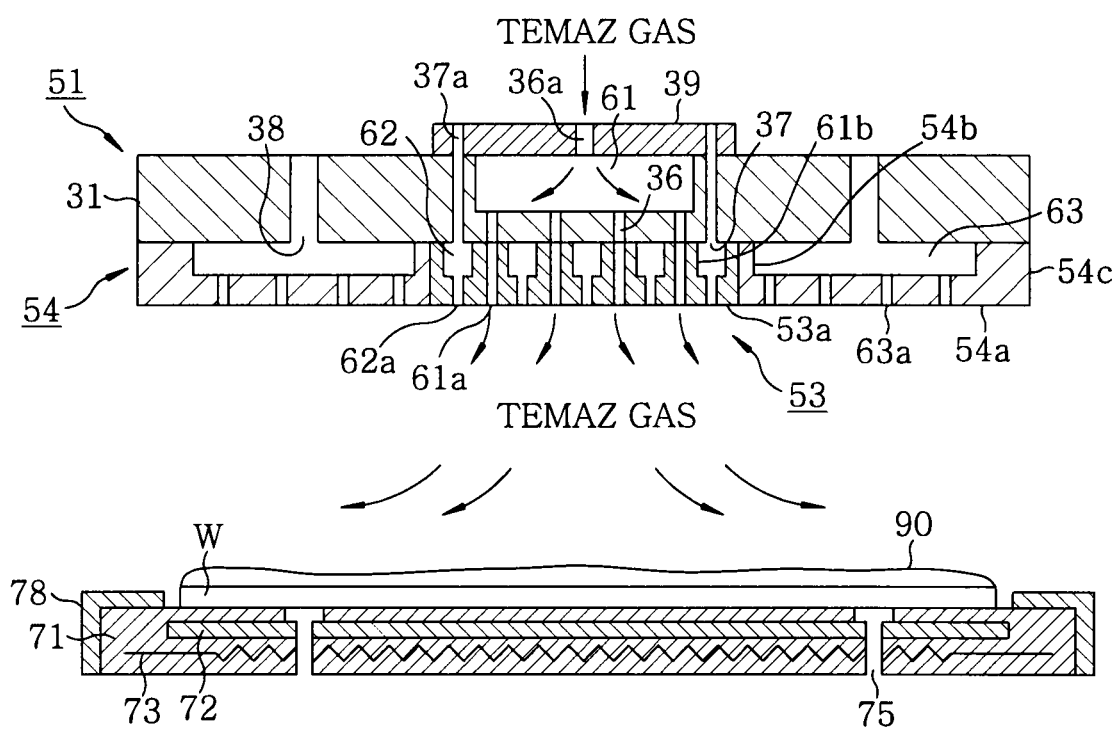
FIGS. 7A and 7B schematically illustrate a film formation process.

Next, the operation of the film forming apparatus 20 will be described with reference to FIGS. 6 to 9. First, the stage 71 is moved down to a transfer position, the wafer W is loaded in the processing chamber 31 through the transfer port 35 by using a transfer unit (not shown) to be mounted on the stage 71, and a gate valve (not shown) is closed (loading step). Then, the wafer W is electrostatically attracted onto the stage 71 by the electrostatic chuck 72, and the stage 71 is elevated to a process position (step S51). Then, the wafer W is heated to a temperature of, e.g., 280° C. by using the heater 73 (energy supplying step) (step S52). Also, the processing chamber 31 is exhausted to vacuum by using a vacuum discharge unit 34. Subsequently, a TEMAZ gas (first processing gas) is supplied to the wafer W at a predetermined flow rate, e.g., 10 mg/min for, e.g., 1.5 seconds from the film forming gas source 84 through the first discharge holes 61a (first processing gas supplying step) (step S53). For example, a nitrogen gas is supplied from the gas supply line 76c to the lower region 12. As a result of this process, the TEMAZ gas is adsorbed on the surface of the wafer W, as shown in FIG. 7A, to uniformly form a thin TEMAZ film 90 having a thickness of, e.g., 0.1 nm. In this process, a purge gas may be supplied at about 300 sccm through the third discharge holes 63a, in order to prevent the TEMAZ gas from flowing into the third diffusion space 63. The stage cover 78, the supporter 76 and the inner wall of the processing chamber 31 form the gas exhaust space 13 having a ring shape, thereby inhibiting extension and contraction of a flow passage. Thus, the TEMAZ gas flows into the gas exhaust line 33 provided under the gas exhaust space 13 without interruption of gas flow while preventing the gas from turning to the lower region 12.

Further, the TEMAZ gas is discharged through the gas exhaust space 13 from the gas exhaust ports 32 provided at the bottom of the processing chamber 31, so that the TEMAZ gas is uniformly discharged toward the periphery on the surface of the wafer W. Further, the gas exhaust ports 32 are arranged at equal intervals at four locations on the bottom of the processing chamber 31. Accordingly, the atmosphere of the gas exhaust space 13 is peripherally discharged from four directions. At this time, the gas is exhausted by strong suction at portions adjacent to the gas exhaust ports 32, so that there is variation in gas flow rate in a circumferential direction near the bottom surface of the processing chamber. However, in order to reduce the difference in the gas flow rate, the gas exhaust space 13, which has a ring shape and a large vertical length, is formed between the gas exhaust ports 32 and the wafer W, or the volume V1 of the processing region 11 is reduced. As a result, the atmosphere of the processing region 11 is radially discharged from the center of the wafer W.

Figure 8:
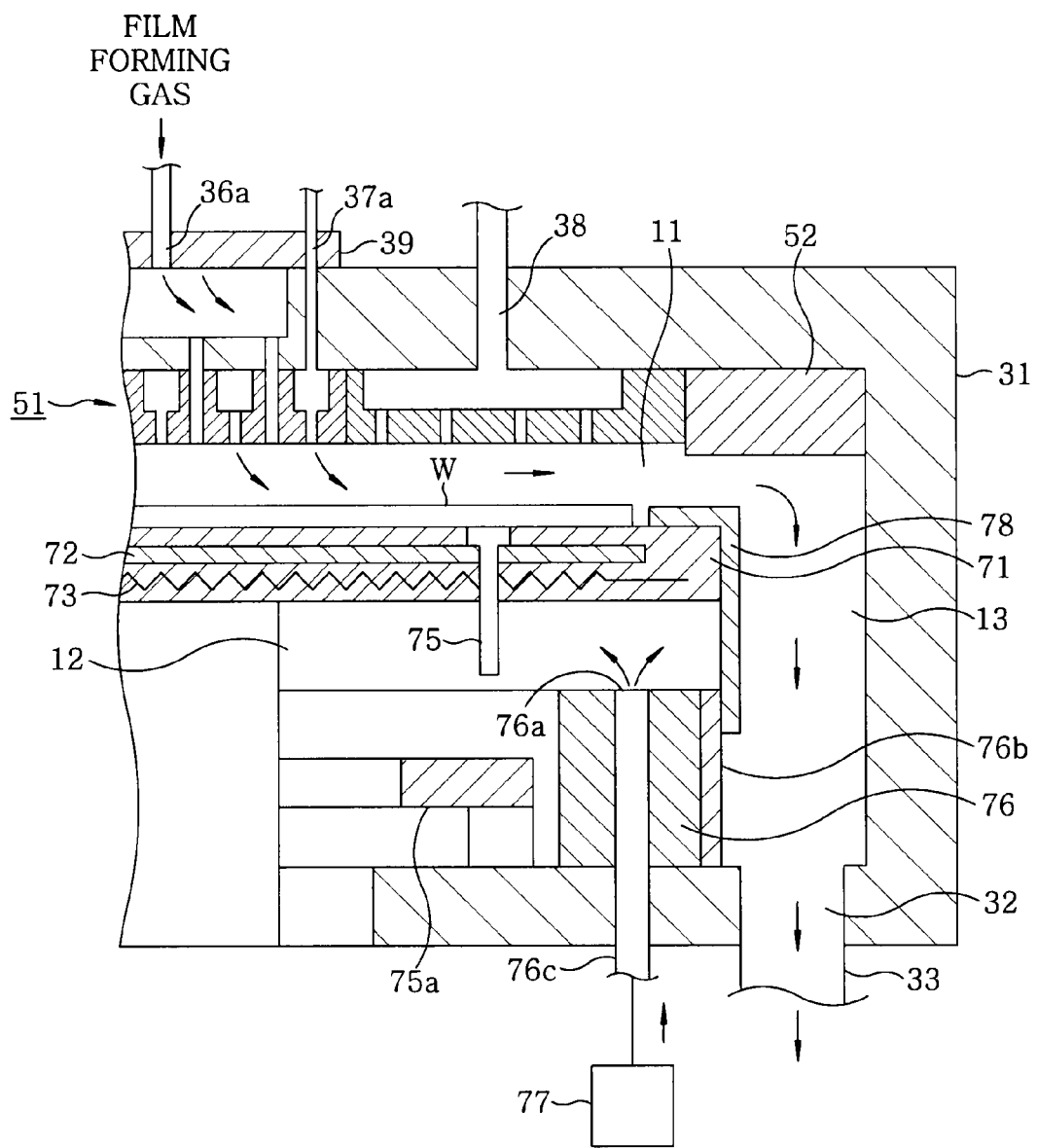
FIG. 8 is a schematic view illustrating a state of a processing chamber during the film formation process.

Further, as shown in FIG. 8, a nitrogen gas is supplied to the lower region 12 such that the pressure of the lower region 12 is slightly higher than that of the processing region 11, thereby preventing the TEMAZ gas from turning to the lower region 12. Accordingly, adhesion of the TEMAZ gas to the pins 75 or the bellows 74 is prevented. The nitrogen gas supplied to the lower region 12 slightly flows into the gas exhaust space 13 through a gap between the stage cover 78 and the supporter cover 76b, and is then discharged together with the TEMAZ gas.

Then, an Ar gas serving as a purge gas is supplied into the processing chamber 31 through the first discharge holes 61a and the third discharge holes 63a for 5 seconds at a flow rate of, e.g., 3 slm, larger than that of the TEMAZ gas (first replacement step) (step S54). Further, a nitrogen gas is supplied from the gas supply line 76c to the lower region 12.

Figure 7B:
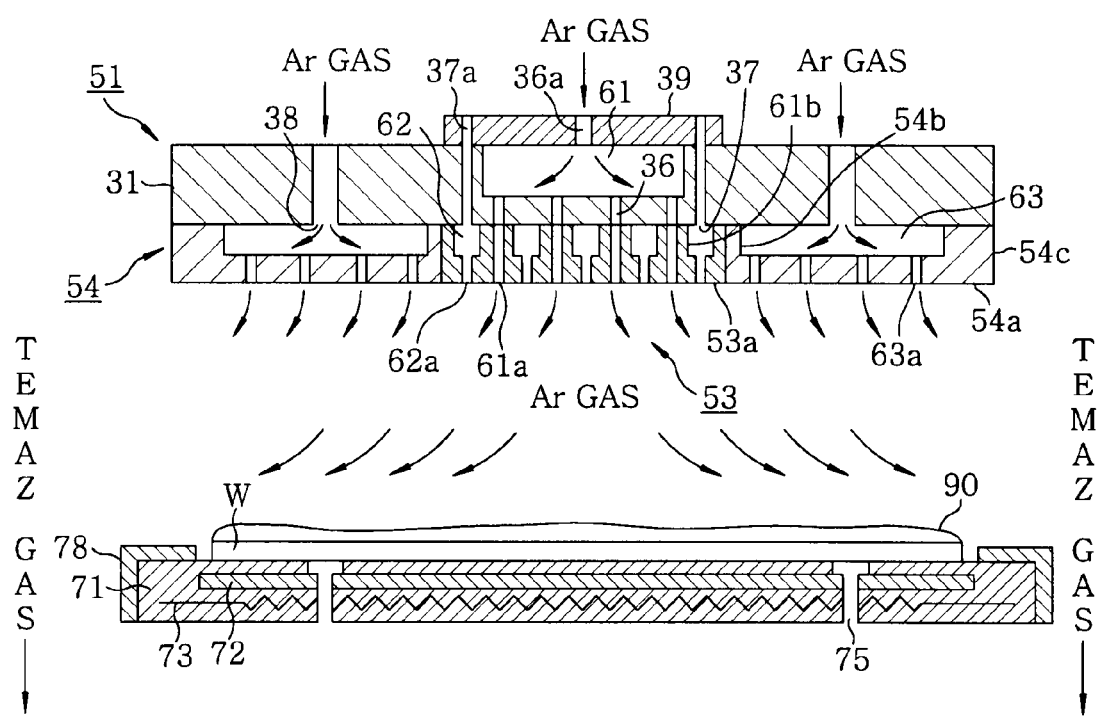

As a result of this process, as shown in FIG. 7B, the TEMAZ gas on the downstream side of the junction between the first gas supply line 81 and the purge gas supply line 81a and in the central region 53 communicating with the first discharge holes 61a is discharged to the processing chamber 31. Further, the TEMAZ gas is ejected toward the periphery of the wafer W by purge gases from the central region 53 and the peripheral region 54, and is discharged through the gas exhaust ports 32 and the gas exhaust line 33. As a result, a purge gas atmosphere is formed in the central region 53 and the processing chamber 31. The flow rate of the purge gas is much greater than that of the TEMAZ gas in step S53. However, the four gas exhaust ports 32 are arranged at equal intervals on the bottom surface of the processing chamber 31 and the ring-shaped gas exhaust space 13 is formed to surround the stage 71. Accordingly, the purge gas is rapidly discharged without stagnation in the vicinity of the wafer W. The flow rate of the purge gas is preferably 3 to 5 slm to improve throughput by reducing gas replacement time. The atmosphere of the processing chamber 31 is switched for a short period of time, e.g., 5 seconds by supplying purge gas at a high flow rate.

Figure 9A:
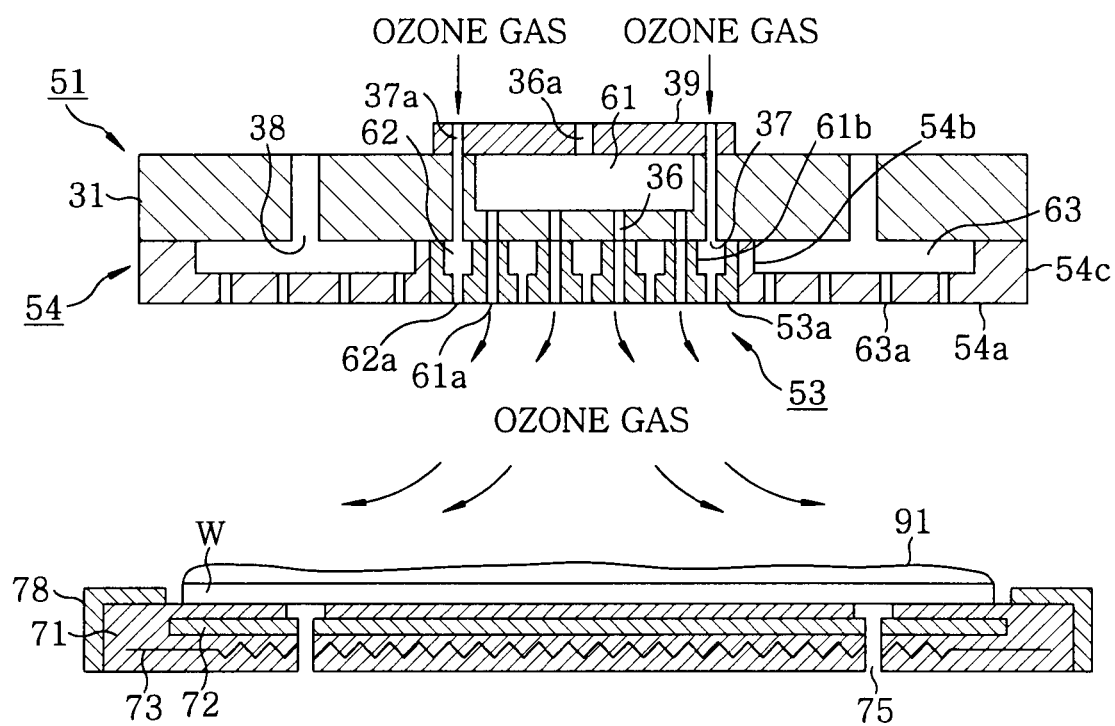
FIGS. 9A and 9B schematically illustrate the film formation process.

Then, an ozone gas (second processing gas) is supplied to the wafer W at a flow rate, e.g., 200 g/Normalm$^3$ (hereinafter, referred to as Nm$^3$) for 3 seconds from the oxidizing gas source 85 through the second discharge holes 62a (second processing gas supplying step) (step S55). Further, in the same way as in step S53, a nitrogen gas is supplied from the gas supply line 76c to the lower region 12. As a result of this process, as shown in FIG. 9A, the TEMAZ film 90 adsorbed on the surface of the wafer W reacts with ozone by thermal energy of a heater 173 to form a $ZrO_2$ film 91 serving as a molecular layer of $ZrO_2$.

Also in this film formation, a purge gas may be supplied at about 300 sccm through the third discharge holes 63a to prevent the ozone gas from flowing into the third diffusion space 63. Since the TEMAZ film 90 adsorbed on the surface of the wafer W is very thin in step S53, the TEMAZ film 90 is uniformly oxidized within a short period of oxidation and converted into the $ZrO_2$ film 91. Also in this process, the ozone gas is prevented from turning to the lower region 12 and is uniformly discharged. Further, an ozone gas may be also supplied through the third discharge holes 63a. In this case, the oxidation is more rapidly performed.

Figure 9B:
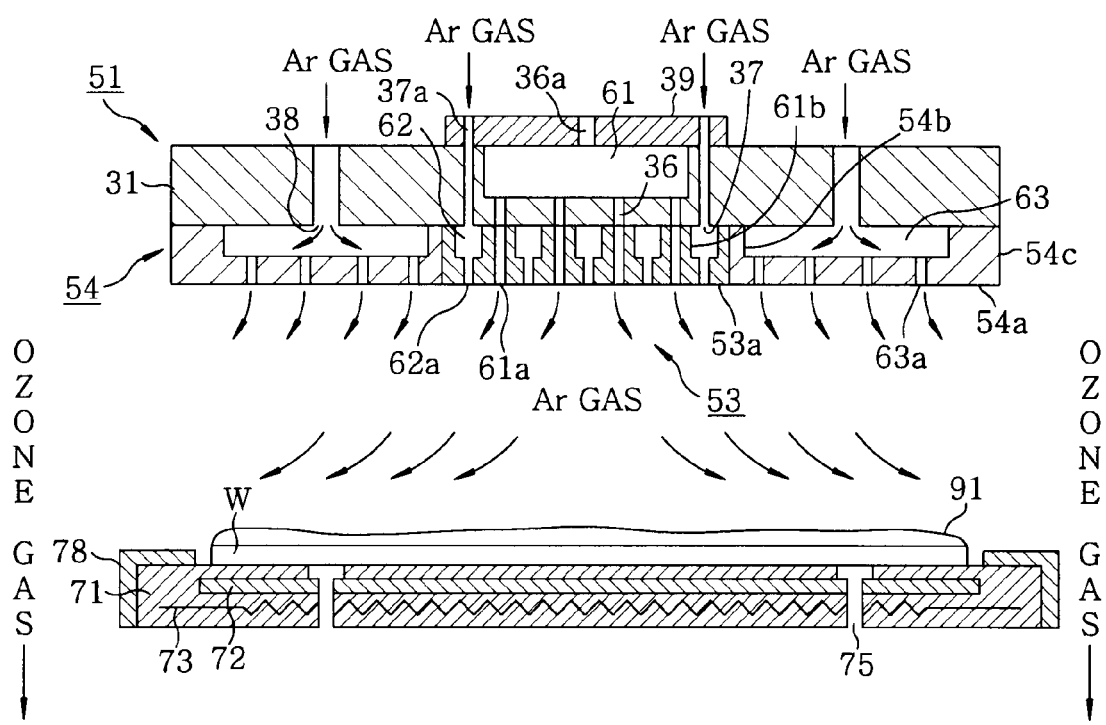

Then, in the same manner as in step S54, the purge gas is supplied at a flow rate of 3 to 5 slm to the processing chamber 31 (second replacement step) (step S56), and a nitrogen gas is supplied to the lower region 12. At this time, the purge gas is supplied from both the second discharge holes 62a and the third discharge holes 63a. As a result, as shown in FIG. 9B, the ozone gas on the downstream side of the junction between the second gas supply line 82 and the purge gas supply line 82a and in the central region is discharged to the processing chamber 31. Thus, the ozone gas in the processing chamber 31 flows radially and isotropically from the center of the wafer semiconductor wafer W and is rapidly discharged from the processing chamber 31.

A series of steps S53 to S56 is repeated, e.g., 100 times (step S57) to obtain multiple molecular layers of $ZrO_2$, so that the $ZrO_2$ film 91 is formed to have a predetermined thickness of, e.g., 10 nm. After the film formation process is completed, the wafer W is unloaded from the processing chamber 31 (step S58).

In accordance with the above embodiment, since the processing gas is supplied from the gas shower head 51, in-plane uniformity of film thickness and film quality is improved compared to a side flow manner, as described above. Further, the gas shower head 51 is divided into the central region 53 and the peripheral region 54 and the film forming gas (first processing gas) and the ozone gas (second processing gas) are alternately supplied from the central region 53. Thus, it is possible to reduce the volume of the gas shower head 51 filled with the processing gas and to shorten time required for replacement of the processing gas in the gas shower head 51. Further, during the replacement of the processing gas, a purge gas is also supplied from the peripheral region 54 of the gas shower head 51, thereby shortening the time required for the replacement of the processing gas and improving throughput. Moreover, the volume of processing gas filled in the gas shower head 51 is small, thereby reducing the amount of processing gas wasted during the replacement of the processing gas.

Further, an area (inner area of the central region 53) on which products obtained by decomposition of the film forming gas are deposited is small, thus shortening a period taken for manual cleaning. As a result, throughput is improved and maintenance becomes easier. Although a gas is supplied from the central region 53 having a small area relative to the diameter of wafer W, the height of the processing region 11 (the distance between the wafer W and the gas shower head 51) and process conditions are adjusted, so that in-plane uniformity is sufficiently obtained.

Further, the ozone gas is inexpensive compared to the film forming gas. Accordingly, the ozone gas is additionally supplied from the peripheral region 54 in the oxidation process of the TEMAZ film 90, thereby rapidly forming the $ZrO_2$ film 91 and improving throughput.

As described above, the gas is supplied to the wafer W from the gas shower head 51 provided above the wafer W. As apparent from experimental examples which will be described later, the gas can be quickly supplied to the entire surface of the wafer W. Consequently, it is possible to reduce a gas supply amount and improve in-plane uniformity of film thickness and film quality. Further, since the gas is supplied from above, collision (contact) probability between the gas and the wafer W increases. Accordingly, it is possible to improve a reaction rate (yield) of film forming gas and realize film formation at low costs. In particular, when the process requires a high temperature of, e.g., 250° C. or more to decompose the processing gas, the reaction rapidly progresses and, thus, the in-plane uniformity of film thickness and film quality deteriorates in a side flow manner. On the other hand, in this embodiment, since a movement distance of gas on the surface of the wafer W is short, it is possible to improve the in-plane uniformity of film thickness and film quality and shorten a film formation period.

Further, in the film formation performed by supplying the processing gas from the gas shower head 51 by using the above-described ALD method, the processing gas is discharged through the annular gas exhaust space 13 formed to surround the stage 71 and the four gas exhaust ports 32 arranged at equal intervals in a circumferential direction. Accordingly, the atmosphere in the processing region 11 can be isotropically and rapidly discharged. Consequently, when one of the film forming gas and the oxidizing gas is switched by the other, although a purge gas is supplied at a high flow rate of, e.g., 3 to 5 slm, it can be discharged rapidly within, e.g., 5 seconds without stagnation. Thus, it is possible to shorten gas replacement time and improve throughput. Further, the gas is uniformly supplied from the gas shower head 51 to the wafer W while the gas is isotropically discharged from the processing region 11. Accordingly, even when the $ZrO_2$ film 91 is formed at a high temperature of, e.g., 280° C., the film formation having the in-plane uniformity of film thickness and film quality can be achieved. Therefore, throughput is further improved. The method of this embodiment is very effective in realizing the film formation using a so-called ALD method.

Figure 10:
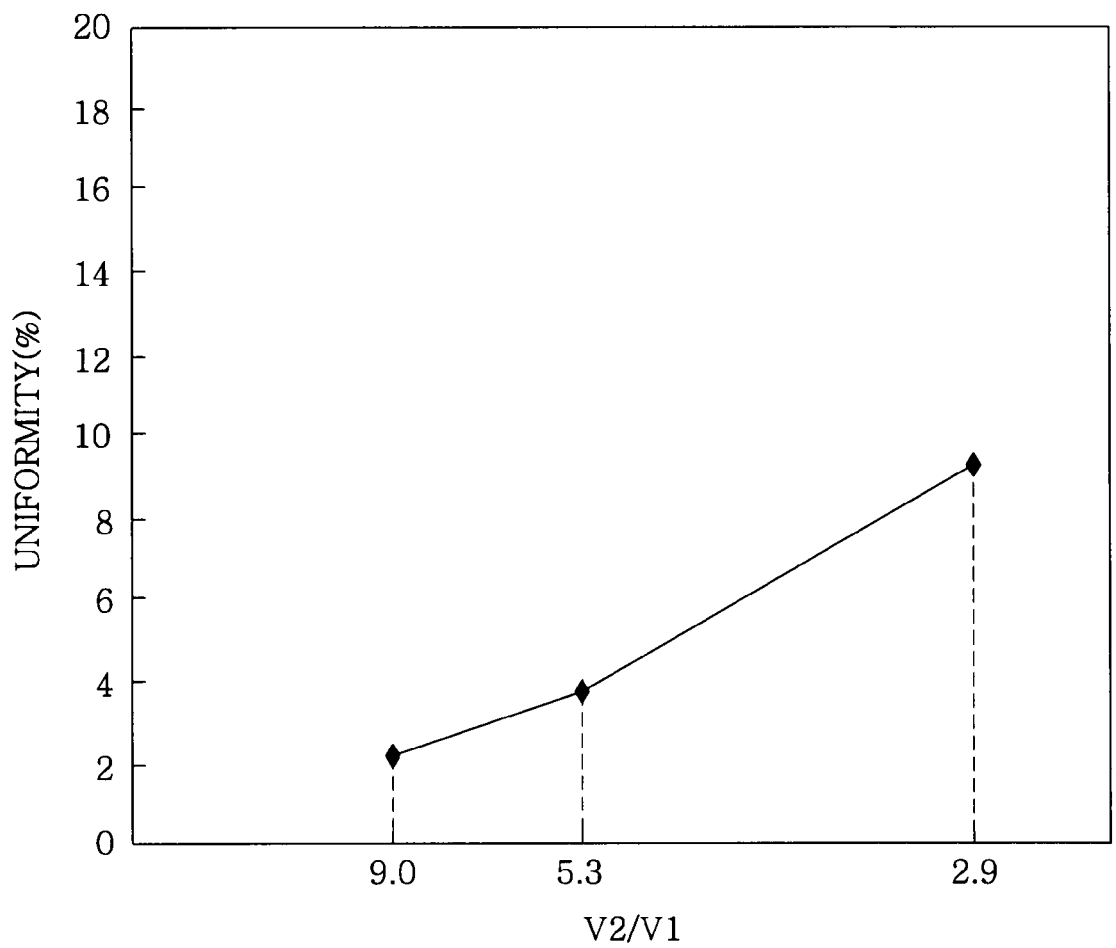
FIG. 10 is a characteristic graph showing a relationship between a ratio (V2/V1) of a volume V2 of a gas exhaust space to a volume V1 of a processing region and a film thickness.

The processing region 11 has a small volume V1 (1.07 liter), and the gas exhaust space 13 has a volume V2 (9.61 liter) larger than the volume V1 of the processing region 11 such that the ratio of the volume V2 and the volume V1 (V2÷V1) is adjusted to 9.0. As a result, during the gas replacement, the atmosphere of the processing region 11 is rapidly transferred to the gas exhaust space 13, thereby shortening the gas replacement period. Further, the vertical dimension of the processing chamber 31 may be lengthened or the distance h between the gas shower head 51 and the wafer W may be shortened in order to adjust the ratio to 9.0 or more. FIG. 10 is data showing film thickness uniformity in a case where the $ZrO_2$ film 91 was formed while changing the height h in FIGS. 2 to 8 mm, 13.5 mm and 25 mm to vary V2/V1. As can be seen from the data, V2/V1 needs to be 9 or more to realize uniformity of 3% or less.

Further, the stage cover 78 and the supporter 76 are provided such that the lower region 12 is formed under the stage 71 to be separated from the gas exhaust space 13. Accordingly, although the stage 71 is elevated, it is possible to prevent the film forming gas from turning to the lower region 12 and to prevent film forming species from being adhered to the lower region 12, thereby preventing damage to the bellows 74. By providing the stage cover 78 and the supporter 76, there is a further effect of forming the gas exhaust space 13 without any additional member.

Further, e.g., a nitrogen gas is supplied to the lower region 12, to make the pressure of the lower region 12 higher than the pressure inside the processing chamber 31 (the pressure of the processing region 11). Thus, it is possible to further prevent the film forming gas from turning to the lower region 12.

The film forming gas is not in contact with the ozone gas in the central region 53 and, thus, generation of $ZrO_2$ is prevented in the central region 53. Consequently, it is possible to reduce an amount of the processing gas wasted and prevent generation of particles. Further, to allow the film forming gas to be mixed with ozone gas in the central region 53, respective gases may share a common passage in the central region 53, which will be described in detail.

Figure 11:
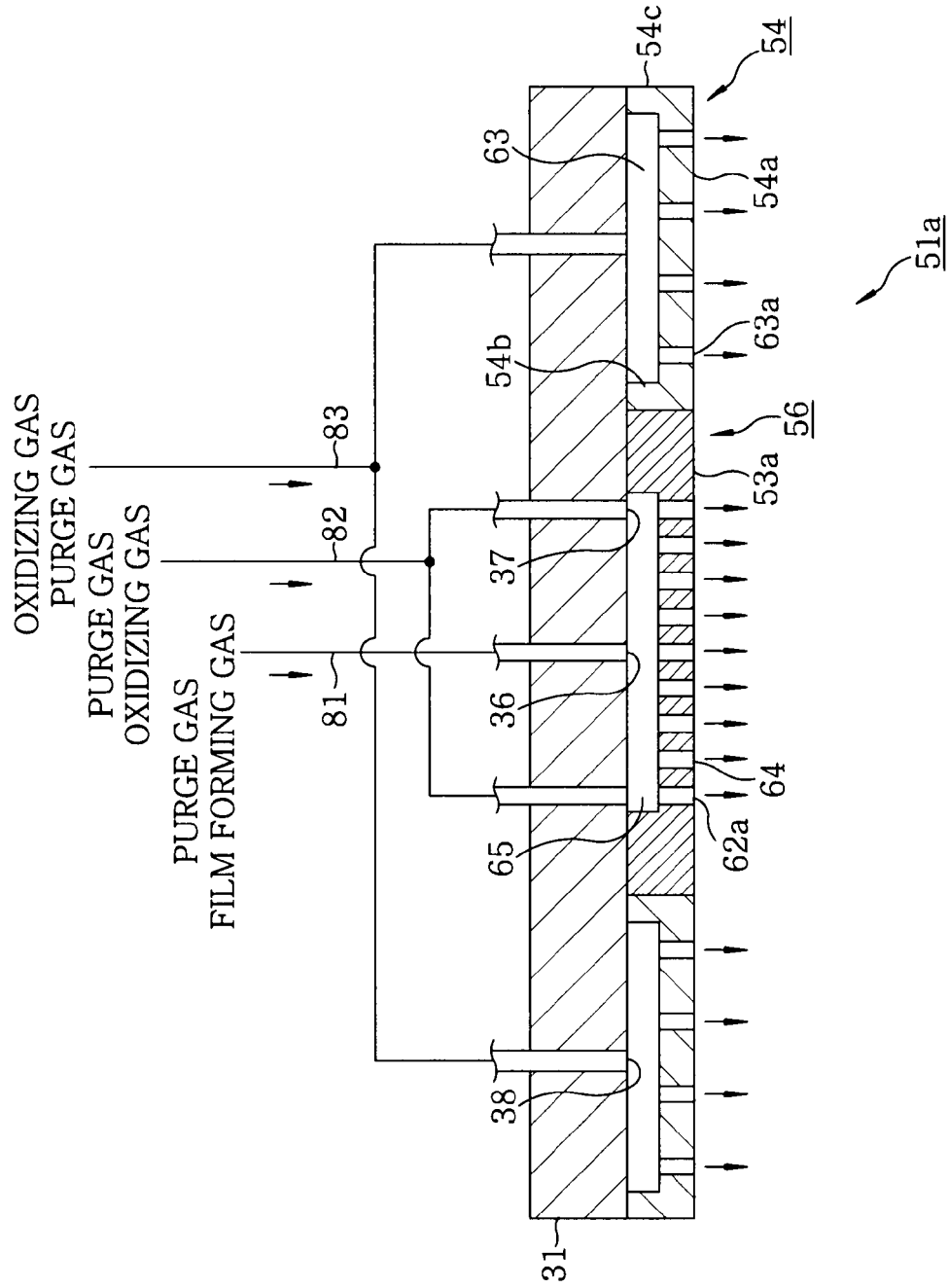
FIG. 11 is a longitudinal cross sectional view illustrating one example of a gas shower head provided in a film forming apparatus in accordance with a second embodiment of the present invention.
Figure 12:
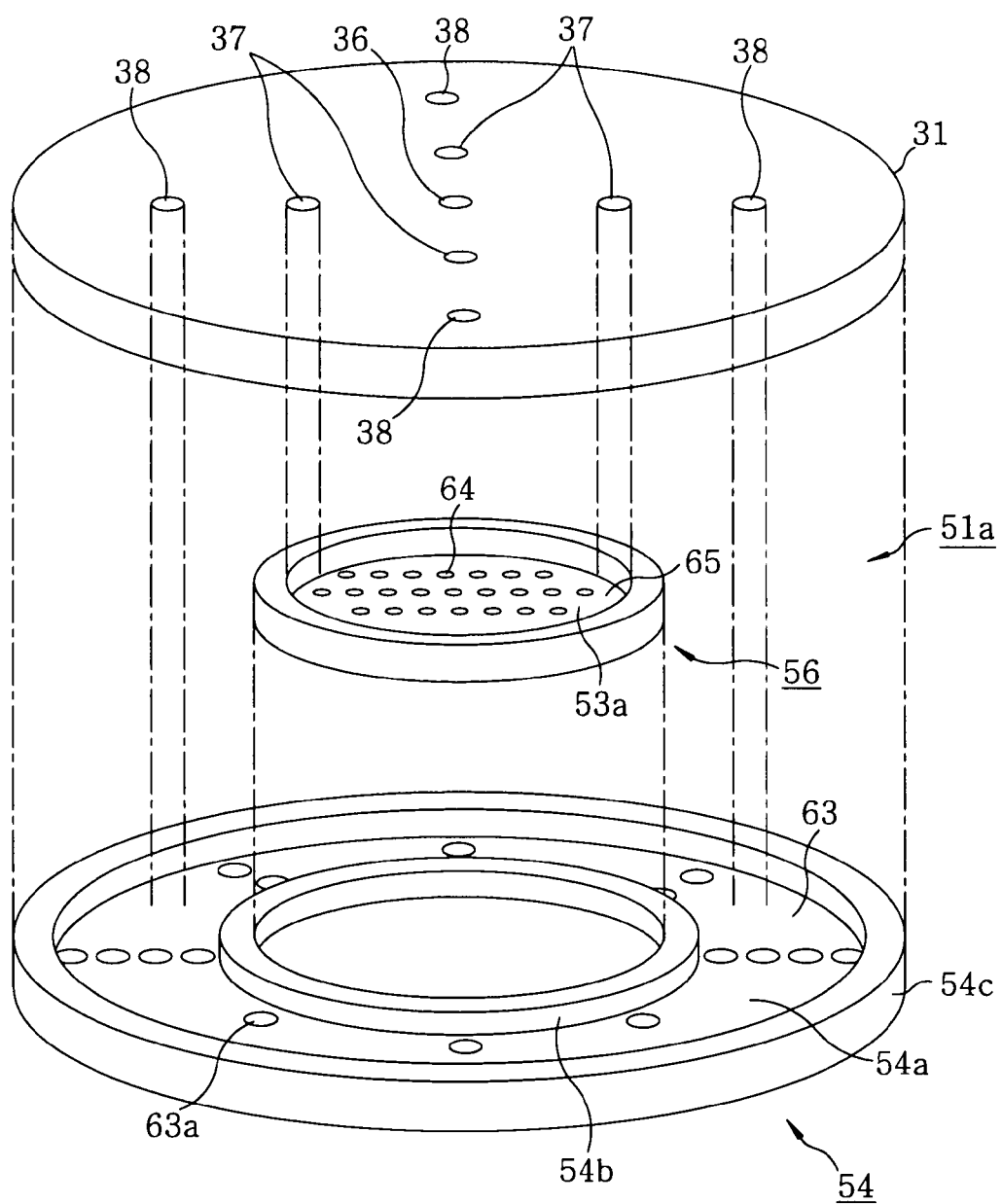
FIG. 12 is an exploded perspective view of the gas shower head.

FIGS. 11 and 12 show a gas shower head 51a in accordance with a second embodiment of the present invention. The film forming apparatus of the second embodiment has the same configuration as the aforementioned film forming apparatus 20 except for the gas shower head 51a and an explanation thereof is omitted. The peripheral region 54 of the gas shower head 51a has the same configuration as that of the gas shower head 51. However, a central region 56 of the gas shower head 51a has a structure wherein the first processing gas and the second processing gas are discharged through discharge holes 64 formed over the entire bottom surface of the cylindrical body 53a without passing through the respective passages.

The inner space of the cylindrical body 53a forms a diffusion space 65 in which the first processing gas and the second processing gas diffuse.

Further, the processing chamber 31 is directly to the first gas supply line 81 and the second gas supply line 82 without the cover 39 provided on the top wall thereof. Also in this case, the central region 56 and the peripheral region 54 come in close contact with the top wall of the processing chamber 31 via seal members inserted into grooves (not shown). Further, in the same way as in FIG. 4, the central region 56, the peripheral region 54 and the processing chamber 3 are in close contact with one another via the bolts and screw holes (not shown).

Also in this embodiment, the film formation process is performed in the same manner as in the first embodiment and similar effects are thus obtained.

Further, in the above-described embodiments, the first gas supply line 81 and the second gas supply line 82 are connected to purge gas supply lines 81a and 82a such that the purge gas is supplied through the first gas supply line 81 and the second gas supply line 82 to the central region 53. However, the purge gas may be supplied independently of the first gas supply line 81 and the second gas supply line 82. In this case, the film forming gas source 84 is connected to the first gas supply line 81, and the purge gas source 86 is connected to the cover 39 via a purge gas channel (not shown). In this configuration, at steps S54 and S56, the processing gas in the central region 53 is discharged by the purge gas, but the processing gas present in the first gas supply line 81 and the second gas supply line 82 is not discharged. Accordingly, the configurations of the first and second embodiments are preferable.

Further, although a $ZrO_2$ film is formed by using a TEMAZ gas as a first processing gas in the above embodiments, for example, TEMAH(tetrakis(ethylmethylamino)hafnium) gas, 3DMAS(tris(dimethylamino)silane) gas, $Sr(METHD)_2$ (bis(methoxyethoxytetramethylheptanedionate)strontium) gas, TDMAT(tetrakis(dimethylamino)titanium) gas, $La(dpm)_3$ (trisdipybaroil metanatolanthanum) gas or $Y(iPr_2amd)$ gas may be used as a film forming gas. The film forming gas may be adsorbed on a wafer W and then oxidized, to form a film made of a high-k dielectric material such as $HfO_2$, HfSiO, SrTiO, $LaO_2$ or Y-doped HfO. In this case, process conditions (process time and process temperature), and the temperature of the gas exhaust line 33 are suitably determined. Further, although a heater is used as an energy supply unit for supplying energy to react a TEMAZ gas with an ozone gas on the wafer W in the above embodiments, but optical energy of, e.g., ultraviolet light may be used.

EXAMPLES

Example 1

Next, experiments performed to confirm effects of the present invention will be described.

In the experiments, film formation was performed under the following process conditions and properties such as film thickness were measured.

(Process Conditions)
Gas type (film forming gas/oxidizing gas): TEMAZ gas/ozone gas=10, 25, 50, 100 (mg/min)/200 (g/Nm$^3$)
Process time (film formation/oxidation): 1.5/3 sec
Process temperature: 250° C.
Gas replacement time (film formation/oxidation): 5/5 sec
Number of times film formation/oxidation is repeated: 100 times Experimental Example 1

The experiment was carried out in the film forming apparatus 20 including the gas shower head 51.

Comparative Example 1

Figure 15:
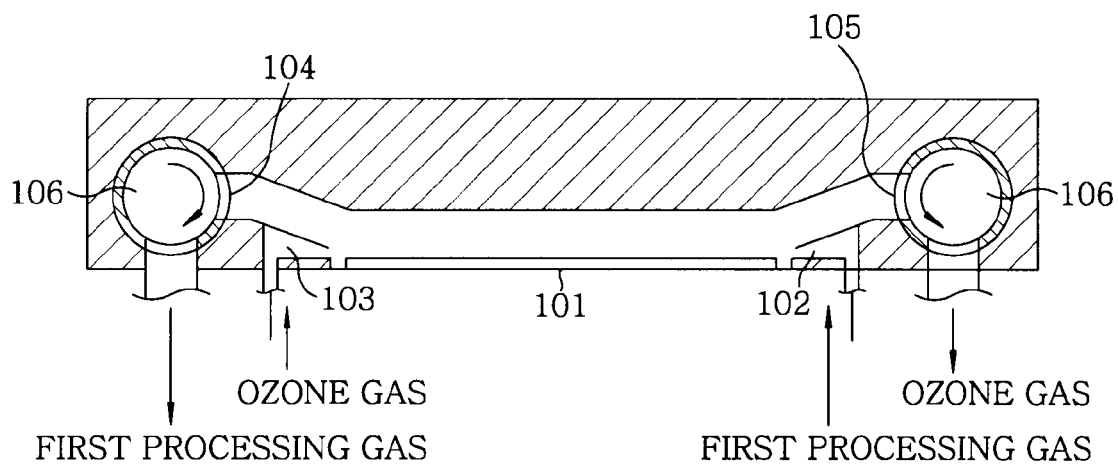
FIG. 15 is a longitudinal cross sectional view illustrating an example of a conventional film forming apparatus.
Figure 16A:
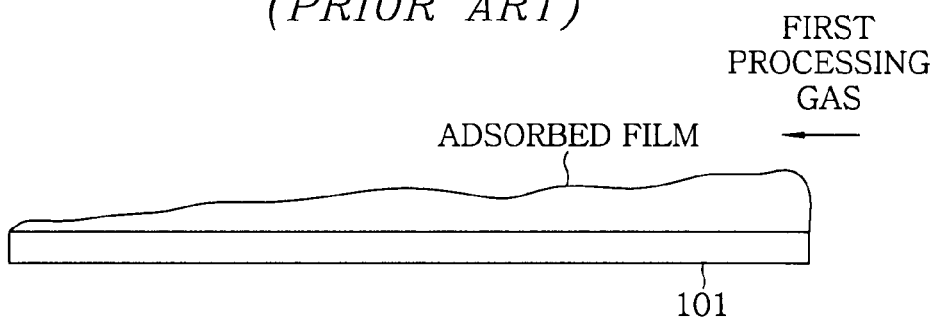
FIGS. 16A to 16C are schematic views illustrating film formation using the film forming apparatus shown in FIG. 15.
Figure 16B:
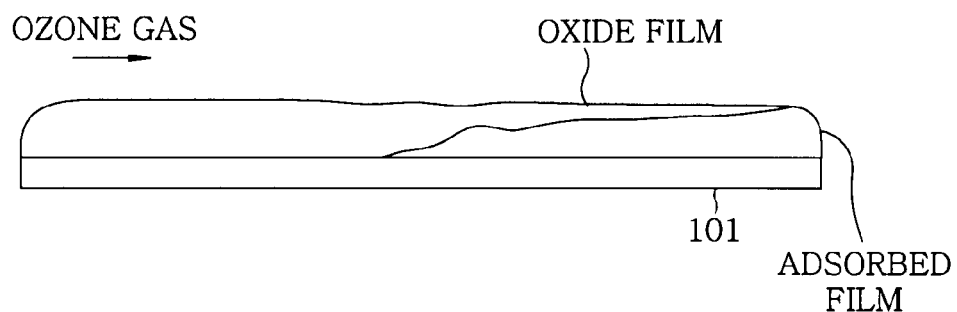
Figure 16C:
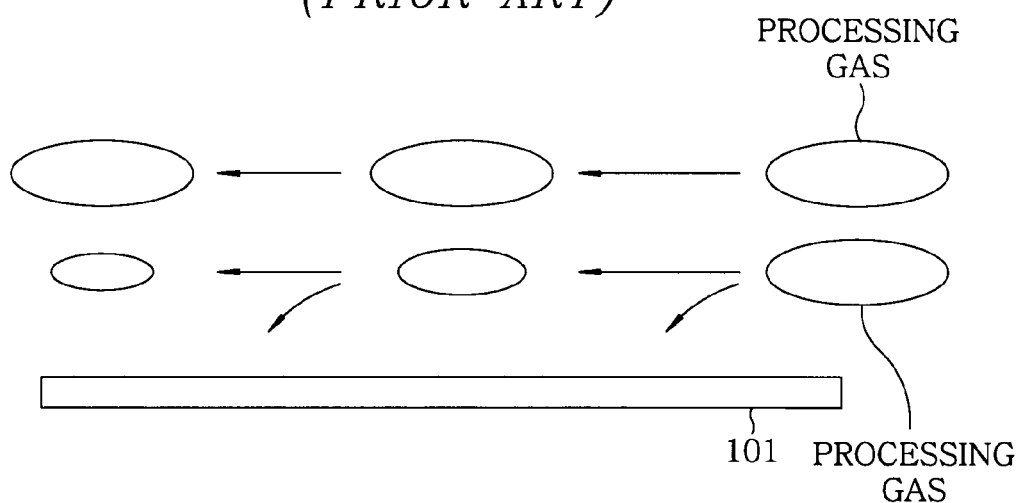
Figure 17:
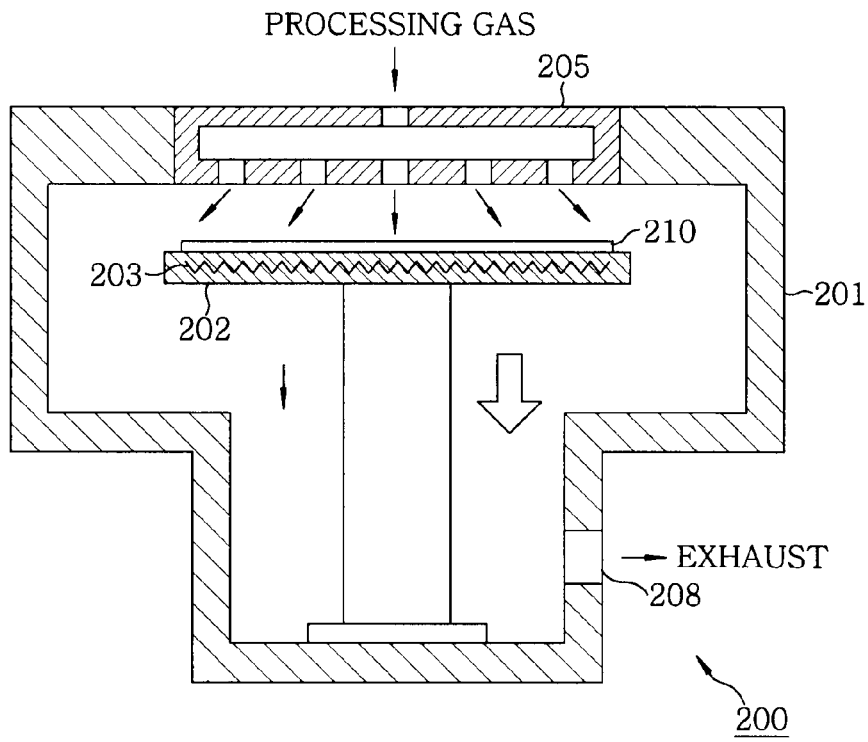
FIG. 17 is a longitudinal cross sectional view illustrating one example of a conventional film forming apparatus.
Figure 18:
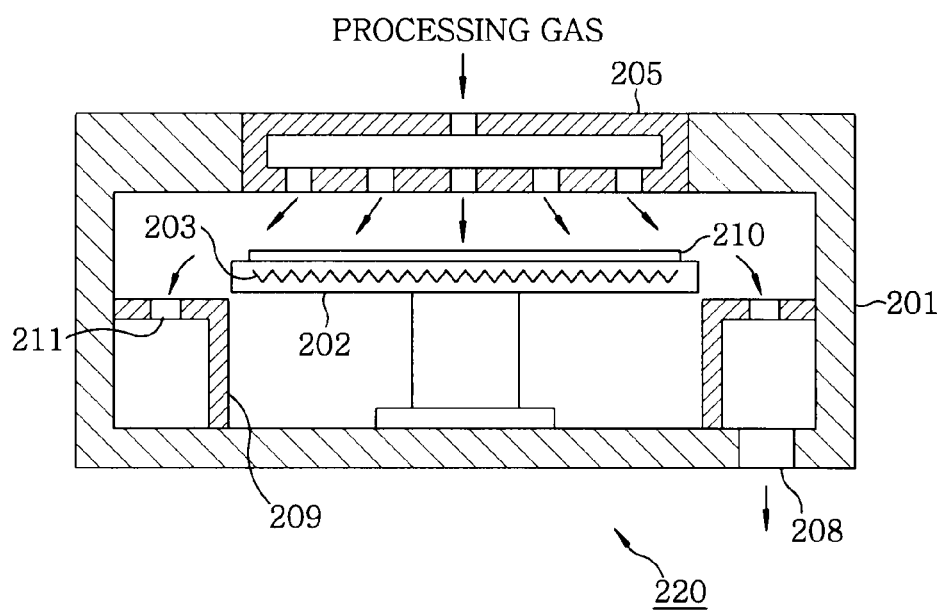
FIG. 18 is a longitudinal cross sectional view illustrating another example of a conventional film forming apparatus.

The experiment was carried out in the film forming apparatus 100 shown in FIG. 15.

(Experimental Results)

Figure 13A:
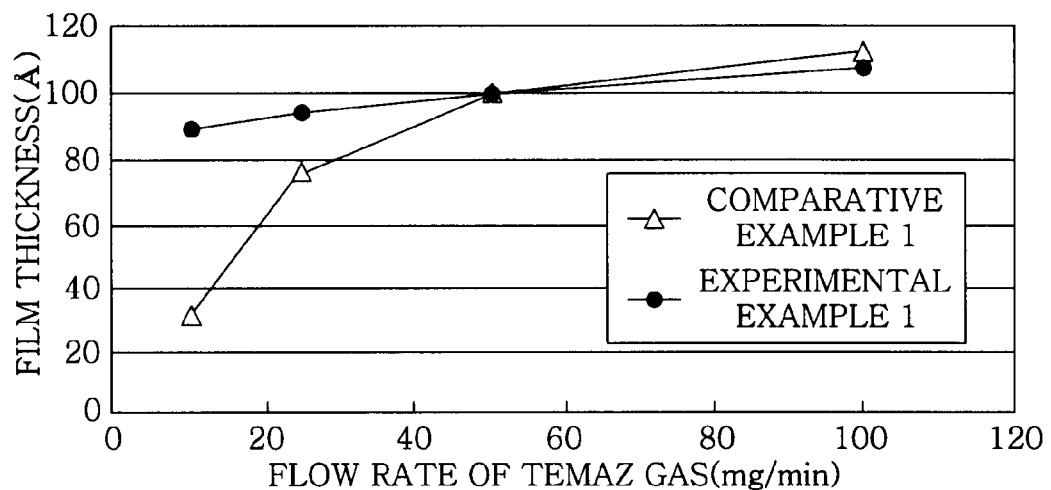
FIGS. 13A and 13B are characteristic graphs showing the results of Examples in accordance with the embodiments of the present invention.
Figure 13B:
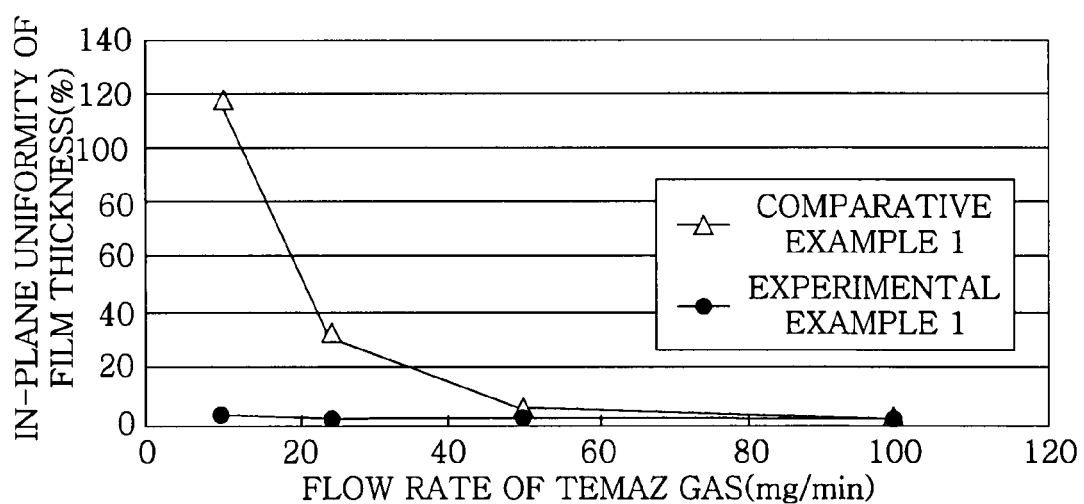

As can be seen from FIGS. 13A and 13B, in Experimental Example 1, film thickness and uniformity of film thickness were good even at a low flow rate of TEMAZ gas. This indicates that collision (contact) probability between the gas and the wafer W and film formation efficiency were increased because the film forming gas was isotropically supplied from above the wafer W. That is, the reaction was sufficiently performed even at a low flow rate. Further, from improvement of in-plane uniformity of film thickness as shown in FIG. 13B, it can be seen that source gases were isotropically supplied and discharged, and a film formation process was uniformly performed.

Meanwhile, in Comparative Example 1, film thickness and uniformity of film thickness were poor at a low flow rate. This is due to the fact that collision probability between the wafer W and the gas was low and a film thickness gradient was formed from one end of the wafer W to the other end thereof, since the gas was supplied to the wafer W in a lateral direction, as mentioned above. As the flow rate increased, film thickness and uniformity of film thickness were improved in Comparative Example 1. This means that an amount of waste gas is large at a low flow rate. As can be seen from FIGS. 13A and 13B, in Experimental Example 1, sufficient film thickness and uniformity of film thickness can be obtained even at about 20% of the flow rate of Comparative Example 1.

Example 2

Next, in the same manner as mentioned above, experiments were carried out under the following conditions.
(Process Conditions)
Process time (film formation/oxidation): 1.5/3 sec
Gas replacement time (film formation/oxidation): 5/5 sec
Number of times film formation/oxidation is repeated: 100

Experimental Example 2

Gas type (film forming gas/oxidizing gas): TEMAZ gas/ozone gas=10 (mg/min)/200 (g/Nm$^3$)
Process temperature: every 5° C. from 240° C. to 270° C., every 10° C. from 270° C. to 300° C.
Further, the experiment was carried out in the film forming apparatus 20 including the gas shower head 51.

Comparative Example 2

Gas type (film forming gas/oxidizing gas): TEMAZ gas/ozone gas=100 (mg/min)/200 (g/Nm$_3$)
Process temperature: every 5° C. from 235° C. to 270° C.
Further, the experiment was carried out in the film forming apparatus 100 shown in FIG. 15.

Further, from the results of Example 1, good results were not obtained in the film forming apparatus 100 when the TEMAZ gas was supplied at a low flow rate. Accordingly, in Comparative Example 2, the TEMAZ gas was supplied at a flow rate of 100 mg/min. Further, at a temperature of 270° C. or more, the experiment of Comparative Example 2 was not performed because there was a definite difference between Experimental Example 2 and Comparative Example 2.

(Experimental Results)

Figure 14A:
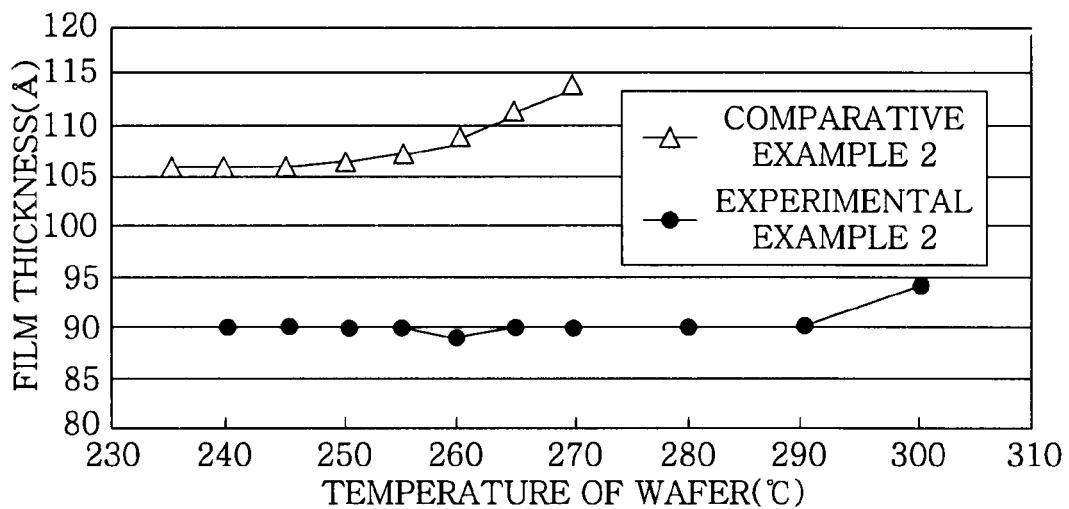
Figure 14B:
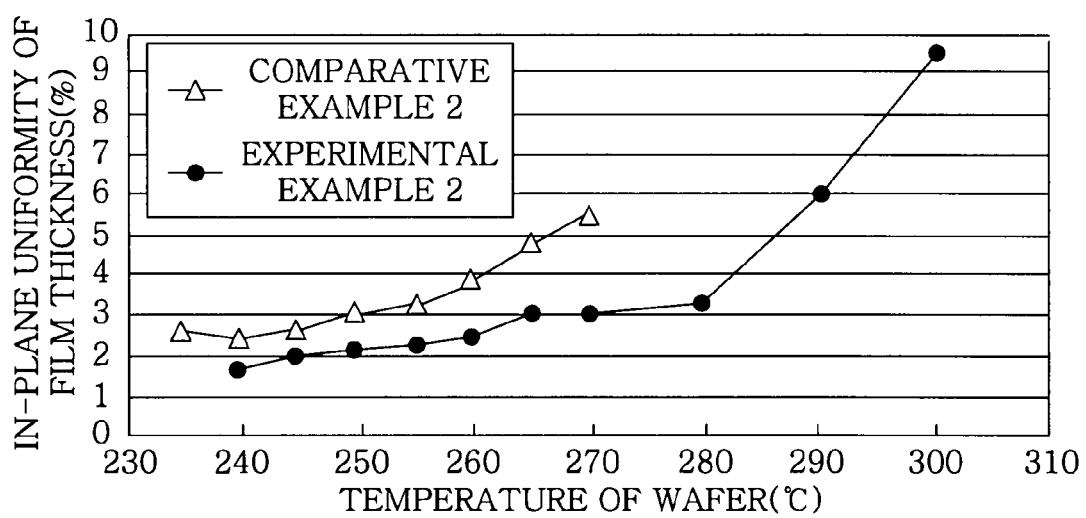

Differing from the case of Comparative Example 2, film thickness and uniformity thereof in Experimental Example 2 were not varied a lot and stable even though a process temperature was increased as can be seen from FIGS. 14A and 14B. This behavior indicates that the reaction sufficiently proceeded even at a low temperature in Experimental Example 2. That is, as the process temperature increases, decomposition of the film forming gas proceeds and a high purity $ZrO_2$ film 91 is thus obtained. In Experimental Example 2, a high purity $ZrO_2$ film 91 having in-plane uniformity of film thickness was obtained. That is, since the gas was uniformly supplied and discharged, there was no deviation in film thickness even at a higher temperature and, thus, a high purity film could be obtained.

Meanwhile, in Comparative Example 2, film formation could not be properly performed at a high temperature because in-plane uniformity of film thickness was deteriorated when a process temperature was increased. Further, from the results obtained by measuring concentration of impurities present in the film and surface roughness, it was found that film properties in Experimental Example 2 were twice as good as those of Comparative Example 2.

Further, refractive index of Experimental Example 2 was also better than that of Comparative Example 2.

What is claimed is:

1. A film forming apparatus comprising:
a processing chamber;
a mounting table disposed in the processing chamber to mount a substrate thereon;
a gas shower head facing the substrate mounted on the mounting table, having gas supply holes, and including a central region facing a central portion of the substrate and a peripheral region facing a peripheral portion of the substrate;
a first processing gas supply unit including a first processing gas supply line which is configured to supply a first processing gas only to the central region of the gas shower head;
a second processing gas supply unit including a second processing gas supply line to supply a second processing gas to the central region of the gas shower head;
an energy supply unit for supplying energy to the substrate;
a purge gas supply unit for supplying a purge gas to the central region and the peripheral region of the gas shower head; and
a control unit configured to control the first and the second processing gas supply unit, the energy supply unit, and the purge gas supply unit to perform operations including:
supplying the first processing gas only to the central region of the gas shower head through the first processing gas supply line so that the first processing gas is adsorbed on the substrate;
stopping said supplying the first processing gas and then supplying the purge gas to the central region and the peripheral region of the gas shower head;
stopping supplying the purge gas to the central region of the gas shower head and then supplying the second processing gas to the central region of the gas shower head; and
supplying the energy to the substrate so that the first processing gas adsorbed on the substrate reacts with the second processing gas,
wherein the control unit is configured such that the film forming apparatus performs, by the operations, an atomic layer deposition on the substrate, and
wherein an area of the central region of the gas shower head is 50% or less of an area of the peripheral region of the gas shower head.

2. The apparatus of claim 1, wherein the first processing gas supply line is independent of the second processing gas supply line.

3. The apparatus of claim 1, wherein the first processing gas supply line and the second processing gas supply line share, at least partially, a common passage.

4. The apparatus of claim 1, wherein the energy supply unit includes a heater to heat the substrate mounted on the mounting table.

5. The apparatus of claim 1, wherein the first processing gas includes a film forming gas to form a film made of a compound containing at least one selected from a group consisting of Zr, Hf, Si, Sr, Ti, Y and La, and the second processing gas includes an oxidizing gas for oxidizing the compound to obtain a high-k dielectric material.

6. The apparatus of claim 1, wherein the control unit is configured to control the purge gas supply unit to supply the purge gas to the peripheral region of the gas shower head when said supplying the first process gas is performed.

7. The apparatus of claim 1, wherein the first processing gas supply line and the second processing gas supply line extend to the central region of the gas shower head, and
wherein the first processing gas supply line and the second processing gas supply line are independent of each other.

8. The apparatus of claim 1, further comprising:
a gas supply unit disposed below the mounting table for supplying a gas to a space below the mounting table.

9. The apparatus of claim 1, wherein the control unit is configured to control the second processing gas supply unit such that the second processing gas is supplied only through the peripheral region of the gas shower head.

* * * * *